(12) United States Patent
Yamazaki

(10) Patent No.: US 9,117,732 B2
(45) Date of Patent: Aug. 25, 2015

(54) DISPLAY DEVICE AND MANUFACTURING METHOD THEREOF

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/515,570

(22) Filed: Oct. 16, 2014

(65) Prior Publication Data

US 2015/0034951 A1    Feb. 5, 2015

Related U.S. Application Data

(62) Division of application No. 13/011,513, filed on Jan. 21, 2011, now Pat. No. 8,866,984.

(30) Foreign Application Priority Data

Jan. 24, 2010    (JP) ................................ 2010-012663

(51) Int. Cl.
 *G02F 1/136* (2006.01)
 *H01L 33/00* (2010.01)
 (Continued)

(52) U.S. Cl.
 CPC ............ *H01L 27/153* (2013.01); *G02F 1/1368* (2013.01); *G02F 1/133345* (2013.01);
 (Continued)

(58) Field of Classification Search
 CPC .................. G02F 1/136; H01L 33/00
 USPC ..................................... 349/46, 43
 See application file for complete search history.

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

EP    1006589 A    6/2000
EP    1737044 A    12/2006
(Continued)

OTHER PUBLICATIONS

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

(Continued)

*Primary Examiner* — Kaveh Kianni
(74) *Attorney, Agent, or Firm* — Fish & Richardson P.C.

(57) ABSTRACT

Disclosed is a display device including a transistor showing extremely low off current. In order to reduce the off current, a semiconductor material whose band gap is greater than that of a silicon semiconductor is used for forming a transistor, and the concentration of an impurity which serves as a carrier donor of the semiconductor material is reduced. Specifically, an oxide semiconductor whose band gap is greater than or equal to 2 eV, preferably greater than or equal to 2.5 eV, more preferably greater than or equal to 3 eV is used for a semiconductor layer of a transistor, and the concentration of an impurity which serves as a carrier donor included is reduced. Consequently, the off current of the transistor per micrometer in channel width can be reduced to lower than 10 zA/μm at room temperature and lower than 100 zA/μm at 85° C.

19 Claims, 14 Drawing Sheets

(51) Int. Cl.
  *H01L 27/15* (2006.01)
  *G02F 1/1368* (2006.01)
  *H01L 27/12* (2006.01)
  *H01L 29/66* (2006.01)
  *H01L 29/786* (2006.01)
  *G02F 1/1333* (2006.01)
  *G02F 1/1362* (2006.01)
  *H01L 29/12* (2006.01)
  *G02F 1/1335* (2006.01)
  *G09G 3/34* (2006.01)
  *G09G 3/36* (2006.01)
  *H01L 27/32* (2006.01)

(52) U.S. Cl.
  CPC ...... *G02F1/136277* (2013.01); *H01L 27/1225* (2013.01); *H01L 29/12* (2013.01); *H01L 29/66742* (2013.01); *H01L 29/66969* (2013.01); *H01L 29/7869* (2013.01); *H01L 29/78609* (2013.01); *G02F 1/1336* (2013.01); *G09G 3/3406* (2013.01); *G09G 3/3648* (2013.01); *G09G 2320/0214* (2013.01); *G09G 2320/0626* (2013.01); *G09G 2360/144* (2013.01); *H01L 27/3262* (2013.01)

(56) References Cited

U.S. PATENT DOCUMENTS

| | | |
|---|---|---|
| 5,767,832 A | 6/1998 | Koyama et al. |
| 5,977,940 A | 11/1999 | Akiyama et al. |
| 6,294,274 B1 | 9/2001 | Kawazoe et al. |
| 6,310,600 B1 | 10/2001 | Koyama et al. |
| 6,414,738 B1* | 7/2002 | Fujikawa ............... 349/147 |
| 6,563,174 B2 | 5/2003 | Kawasaki et al. |
| 6,597,348 B1 | 7/2003 | Yamazaki et al. |
| 6,614,418 B2 | 9/2003 | Koyama et al. |
| 6,661,096 B1 | 12/2003 | Takayama et al. |
| 6,727,522 B1 | 4/2004 | Kawasaki et al. |
| 7,049,190 B2 | 5/2006 | Takeda et al. |
| 7,053,969 B2 | 5/2006 | Yamazaki et al. |
| 7,061,014 B2 | 6/2006 | Hosono et al. |
| 7,064,346 B2 | 6/2006 | Kawasaki et al. |
| 7,067,843 B2 | 6/2006 | Carcia et al. |
| 7,105,868 B2 | 9/2006 | Nause et al. |
| 7,129,918 B2 | 10/2006 | Kimura |
| 7,145,536 B1 | 12/2006 | Yamazaki et al. |
| 7,211,825 B2 | 5/2007 | Shih et al |
| 7,212,265 B2 | 5/2007 | Eguchi et al. |
| 7,235,810 B1 | 6/2007 | Yamazaki et al. |
| 7,245,018 B1 | 7/2007 | Takayama et al. |
| 7,282,782 B2 | 10/2007 | Hoffman et al. |
| 7,286,108 B2 | 10/2007 | Tsuda et al. |
| 7,297,977 B2 | 11/2007 | Hoffman et al. |
| 7,317,438 B2* | 1/2008 | Yamazaki et al. ............. 345/88 |
| 7,321,353 B2 | 1/2008 | Tsuda et al. |
| 7,323,356 B2 | 1/2008 | Hosono et al. |
| 7,385,224 B2 | 6/2008 | Ishii et al. |
| 7,385,579 B2 | 6/2008 | Satake |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,470,607 B2 | 12/2008 | Carcia et al. |
| 7,501,293 B2 | 3/2009 | Ito et al. |
| 7,525,614 B2 | 4/2009 | Jeong et al. |
| 7,601,984 B2 | 10/2009 | Sano et al. |
| 7,612,849 B2 | 11/2009 | Eguchi et al. |
| 7,674,650 B2 | 3/2010 | Akimoto et al. |
| 7,732,819 B2 | 6/2010 | Akimoto et al. |
| 7,738,055 B2* | 6/2010 | Egi et al. ............... 349/96 |
| 7,776,712 B2 | 8/2010 | Yamazaki et al. |
| 7,791,072 B2 | 9/2010 | Kumomi et al. |
| 7,791,074 B2 | 9/2010 | Iwasaki |
| 7,791,571 B2* | 9/2010 | Ohtani et al. ............... 345/82 |
| 7,804,088 B2 | 9/2010 | Tanaka et al. |
| 7,816,191 B2 | 10/2010 | Takayama et al. |
| 7,821,613 B2 | 10/2010 | Kimura |
| 7,829,444 B2 | 11/2010 | Yabuta et al. |
| 7,906,429 B2 | 3/2011 | Takayama et al. |
| 7,910,490 B2 | 3/2011 | Akimoto et al. |
| 7,932,521 B2* | 4/2011 | Akimoto et al. ............. 257/72 |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,269,217 B2 | 9/2012 | Arai et al. |
| 8,274,077 B2 | 9/2012 | Akimoto et al. |
| 8,278,136 B2 | 10/2012 | Tanaka et al. |
| 8,330,887 B2 | 12/2012 | Kurokawa et al. |
| 8,362,538 B2 | 1/2013 | Koyama et al. |
| 8,415,665 B2 | 4/2013 | Kimura et al. |
| 8,530,285 B2 | 9/2013 | Yamazaki et al. |
| 8,547,753 B2 | 10/2013 | Takemura et al. |
| 8,593,856 B2 | 11/2013 | Koyama et al. |
| 8,599,177 B2 | 12/2013 | Koyama et al. |
| 8,629,660 B2* | 1/2014 | Nalbant ............... 323/222 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0050193 A1* | 3/2006 | Seki et al. ............... 349/44 |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0183274 A1 | 8/2006 | Carcia et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0001954 A1 | 1/2007 | Shishido et al. |
| 2007/0024187 A1 | 2/2007 | Shin et al. |
| 2007/0046191 A1 | 3/2007 | Saito |
| 2007/0046591 A1 | 3/2007 | Shishido et al. |
| 2007/0052025 A1 | 3/2007 | Yabuta |
| 2007/0054507 A1 | 3/2007 | Kaji et al. |
| 2007/0075627 A1 | 4/2007 | Kimura et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0279344 A1 | 12/2007 | Kimura et al. |
| 2007/0279374 A1 | 12/2007 | Kimura et al. |
| 2007/0287296 A1 | 12/2007 | Chang |
| 2008/0006877 A1 | 1/2008 | Mardilovich et al. |
| 2008/0038882 A1 | 2/2008 | Takechi et al. |

(56) References Cited

U.S. PATENT DOCUMENTS

| | | |
|---|---|---|
| 2008/0038929 A1 | 2/2008 | Chang |
| 2008/0050595 A1 | 2/2008 | Nakagawara et al. |
| 2008/0055218 A1 | 3/2008 | Tsuda et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0284929 A1 | 11/2008 | Kimura |
| 2008/0296568 A1 | 12/2008 | Ryu et al. |
| 2008/0297676 A1 | 12/2008 | Kimura |
| 2008/0308796 A1 | 12/2008 | Akimoto et al. |
| 2008/0308805 A1 | 12/2008 | Akimoto et al. |
| 2009/0002586 A1 | 1/2009 | Kimura |
| 2009/0008639 A1 | 1/2009 | Akimoto et al. |
| 2009/0009455 A1 | 1/2009 | Kimura |
| 2009/0011611 A1 | 1/2009 | Ichijo et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140438 A1 | 6/2009 | Yamazaki et al. |
| 2009/0152506 A1 | 6/2009 | Umeda et al. |
| 2009/0152541 A1 | 6/2009 | Maekawa et al. |
| 2009/0184315 A1 | 7/2009 | Lee et al. |
| 2009/0261325 A1 | 10/2009 | Kawamura et al. |
| 2009/0267064 A1 | 10/2009 | Yano et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0084651 A1 | 4/2010 | Yamazaki et al. |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0155719 A1 | 6/2010 | Sakata et al. |
| 2010/0267198 A1 | 10/2010 | Yabuta et al. |
| 2010/0289020 A1 | 11/2010 | Yano et al. |
| 2010/0320458 A1 | 12/2010 | Umeda et al. |
| 2010/0320459 A1 | 12/2010 | Umeda et al. |
| 2011/0068852 A1 | 3/2011 | Yamazaki et al. |
| 2011/0089927 A1 | 4/2011 | Yamazaki et al. |
| 2011/0090183 A1 | 4/2011 | Yamazaki et al. |
| 2011/0090416 A1 | 4/2011 | Arasawa et al. |
| 2011/0101942 A1 | 5/2011 | Yamazaki et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0147738 A1 | 6/2011 | Yamazaki et al. |
| 2011/0147739 A1 | 6/2011 | Yamazaki et al. |
| 2011/0148455 A1 | 6/2011 | Kato et al. |
| 2011/0148835 A1 | 6/2011 | Yamazaki |
| 2011/0148846 A1 | 6/2011 | Arasawa et al. |
| 2011/0149185 A1 | 6/2011 | Yamazaki |
| 2011/0151618 A1 | 6/2011 | Yamazaki et al. |
| 2011/0156022 A1 | 6/2011 | Yamazaki et al. |
| 2011/0156025 A1 | 6/2011 | Shionoiri et al. |
| 2011/0156994 A1 | 6/2011 | Koyama |
| 2011/0157128 A1 | 6/2011 | Koyama |
| 2011/0157216 A1 | 6/2011 | Yamazaki et al. |
| 2011/0157252 A1 | 6/2011 | Yamazaki et al. |
| 2011/0157253 A1 | 6/2011 | Yamazaki et al. |
| 2011/0157254 A1 | 6/2011 | Yamazaki et al. |
| 2011/0163311 A1 | 7/2011 | Akimoto et al. |
| 2011/0175104 A1 | 7/2011 | Yamazaki |
| 2011/0175883 A1 | 7/2011 | Toyotaka et al. |
| 2011/0175894 A1 | 7/2011 | Wakimoto et al. |
| 2011/0175895 A1 | 7/2011 | Hayakawa et al. |
| 2011/0176652 A1 | 7/2011 | Kurokawa |
| 2011/0180794 A1 | 7/2011 | Yamazaki |
| 2011/0181560 A1 | 7/2011 | Yamazaki |
| 2011/0181802 A1 | 7/2011 | Wakimoto et al. |
| 2011/0193083 A1 | 8/2011 | Kim et al. |
| 2011/0215328 A1 | 9/2011 | Morosawa et al. |
| 2012/0119205 A1 | 5/2012 | Taniguchi et al. |
| 2012/0305913 A1 | 12/2012 | Yamazaki et al. |
| 2013/0127497 A1 | 5/2013 | Koyama |
| 2013/0146882 A1 | 6/2013 | Kimura et al. |

FOREIGN PATENT DOCUMENTS

| | | |
|---|---|---|
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| EP | 2264771 A | 12/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-347831 A | 12/1994 |
| JP | 07-239463 A | 9/1995 |
| JP | 08-264794 A | 10/1996 |
| JP | 09-243994 A | 9/1997 |
| JP | 11-505377 | 5/1999 |
| JP | 2000-044236 A | 2/2000 |
| JP | 2000-150900 A | 5/2000 |
| JP | 2001-312253 A | 11/2001 |
| JP | 2002-014320 A | 1/2002 |
| JP | 2002-050762 A | 2/2002 |
| JP | 2002-076356 A | 3/2002 |
| JP | 2002-083812 A | 3/2002 |
| JP | 2002-289859 A | 10/2002 |
| JP | 2003-086000 A | 3/2003 |
| JP | 2003-086808 A | 3/2003 |
| JP | 2003-131633 A | 5/2003 |
| JP | 2004-103957 A | 4/2004 |
| JP | 2004-273614 A | 9/2004 |
| JP | 2004-273732 A | 9/2004 |
| JP | 2006-502589 | 1/2006 |
| JP | 2006-165527 A | 6/2006 |
| JP | 2006-165528 A | 6/2006 |
| JP | 2006-165529 A | 6/2006 |
| JP | 2006-165531 A | 6/2006 |
| JP | 2007-142196 A | 6/2007 |
| JP | 2008-124215 A | 5/2008 |
| JP | 2008-287042 A | 11/2008 |
| JP | 2009-055008 A | 3/2009 |
| JP | 2009-158940 A | 7/2009 |
| JP | 2009-167087 A | 7/2009 |
| JP | 2009-212443 A | 9/2009 |
| JP | 2009-231613 A | 10/2009 |
| JP | 2009-260378 A | 11/2009 |
| JP | 2009-267399 A | 11/2009 |
| JP | 2009-290113 A | 12/2009 |
| JP | 2010-016347 A | 1/2010 |
| JP | 4415062 | 2/2010 |
| JP | 2010-067954 A | 3/2010 |
| JP | 2010-177431 A | 8/2010 |
| JP | 2010-183027 A | 8/2010 |
| JP | 4571221 | 10/2010 |
| JP | 2012-160679 A | 8/2012 |
| TW | 201003918 | 1/2010 |
| WO | WO-2004/034449 | 4/2004 |
| WO | WO-2004/114391 | 12/2004 |
| WO | WO-2007/058232 | 5/2007 |
| WO | WO-2008/133345 | 11/2008 |

(56) References Cited

FOREIGN PATENT DOCUMENTS

| WO | WO-2009/075281 | 6/2009 |
|----|----------------|--------|
| WO | WO-2009/110623 | 9/2009 |

OTHER PUBLICATIONS

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Nomura.K et al., "Thin-Film Transistor Fabricated in Single-Crystalline Transparent Oxide Semiconductor", Science, May 23, 2003, vol. 300, No. 5623, pp. 1269-1272.

Suzuki.N, "Principle of low-current measurement and actual picoammeter", Oyobuturi, Jul. 10, 2001, vol. 70, No. 7, pp. 865-871, JSAP (The Japan Society of Applied Physics).

Shen.T et al., "A 2-ns Detecting Time, 2-μm CMOS Built-in Current Sensing Circuit", IEEE Journal of Solid-State Circuits, 1993, vol. 28, No. 1, pp. 72-77.

Thelen.D et al., "A Low Noise Readout Detector Circuit for Nanoampere Sensor Applications", IEEE Journal of Solid-State Circuits, Mar. 3, 1997, vol. 32, No. 3, pp. 337-348.

International Search Report (Application No. PCT/JP2010/073868) Dated Feb. 15, 2011.

Written Opinion (Application No. PCT/JP2010/073868) Dated Feb. 15, 2011.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu, or Zn] at temperatures over 1000° C", Journal of Solid State Chemistry, 1985, vol. 60, pp. 382-384.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium—Oxide—Based Thin-Film Transistors by DC Sputtering", SID Digest '09 : SID International Symposium Digest of Technical Papers, May 31, 2009, pp. 191-193.

Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID Digest International Symposium Digest of Technical Papers, May 31, 2009, pp. 578-581.

(56) References Cited

OTHER PUBLICATIONS

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 4144.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies In ZnO", Appl. Phys. Lett. (Applied Physics Letters), 2005, vol. 87, pp. 122102-1-122102-3.

Clark.S et al., "First Principles Methods Using Castep", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides". Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26. pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B. (Physical Review. B), 2008, vol. 77, pp. 245202-1-245202-6.

Kim.S et al., "High-Performance oxide thin film transistors passivated by various gas plasmas"; 214th ECS Meeting, 2008, No. 2317, ECS.

Son.K et al., "42.4L: Late-News Paper: 4 Inch QVGA AMOLED Driven by the Threshold Voltage Controlled Amorphous GIZO (Ga2O3—In2O3—ZnO)TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays". IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced At Room Tempreature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Taiwanese Office Action (Application No. 100100647) Dated May 26, 2015.

\* cited by examiner

DISPLAY DEVICE AND MANUFACTURING METHOD THEREOF

CROSS-REFERENCE TO RELATED APPLICATIONS

This application is a divisional of U.S. application Ser. No. 13/011,513, filed Jan. 21, 2011, now allowed, which claims the benefit of a foreign priority application filed in Japan as Serial No. 2010-012663 on Jan. 24, 2010, both of which are incorporated by reference.

TECHNICAL FIELD

One embodiment of the present invention relates to a display device including a field-effect transistor using an oxide semiconductor.

BACKGROUND ART

A liquid crystal display panel including a thin film transistor using amorphous silicon as a driving element of liquid crystal is widely used in commercial products such as a monitor of a computer and a liquid crystal television. A manufacturing technique of a thin film transistor using amorphous silicon has been already established and a liquid crystal panel with more than 60 inches has been produced.

Since operation speed of a thin film transistor using amorphous silicon is slow and any further high performance cannot be expected, development of a thin film transistor using polysilicon has been underway. However, a crystallization step is required for forming polysilicon, which leads to cause variation in transistor characteristics and inhibits enlargement of a panel area.

In contrast, an oxide semiconductor material has been attracting attention as a transistor material besides a silicon-based material. As an oxide semiconductor material, zinc oxide or a substance containing zinc oxide is known. Thin film transistors each of which is formed using an amorphous oxide (an oxide semiconductor) having an electron carrier concentration of lower than $10^{18}/cm^3$ have been disclosed (see Patent Documents 1 to 3).

REFERENCE

[Patent Document 1] Japanese Published Patent Application No. 2006-165527
[Patent Document 2] Japanese Published Patent Application No. 2006-165528
[Patent Document 3] Japanese Published Patent Application No. 2006-165529

DISCLOSURE OF INVENTION

Although the oxide semiconductor has an electron carrier concentration of lower than $10^{18}/cm^3$, the oxide semiconductor is a substantially n-type oxide semiconductor, and an on-off ratio of the thin film transistors disclosed in the Patent Documents is only about $10^3$. A reason of such low on-off ratio of the thin film transistors is high off current.

For example, in a liquid crystal panel, each pixel includes a storage capacitor provided in parallel to a pixel electrode driving liquid crystal. A transistor is turned on to apply an image signal to the pixel electrode and the storage capacitor, whereby potential is applied to liquid crystal and the storage capacitor is charged to given potential. When this writing operation completes, the transistor is turned off until the next image signal is applied. At this time, when off current of the transistor is high, potential applied to the liquid crystal is fluctuated and electrical charges stored in the storage capacitor are discharged.

In a pixel, a relation between off current i of a transistor, a storage capacitor C, voltage fluctuation V, and a holding time T can be expressed by CV=iT. For example, when off current of a transistor is 0.1 pA, electrostatic capacitance of a storage capacitor is 0.1 pF, and one frame period is 16.6 ms, voltage fluctuation V of a pixel in one frame becomes as follows:

$$0.1 \,[pF] \times V = 0.1 \,[pA] \times 16.6 \,[ms]$$

$$V = 16.6 \,[mV]$$

In the case where the maximum driving voltage of liquid crystal is 5 V and 256 grayscale is displayed, a grayscale voltage for 1 grayscale is approximately 20 mV. When voltage fluctuation of a pixel is 16.6 mV as described above, this corresponds to a grayscale voltage for approximately 1 grayscale. Further, in the case where 1024 grayscale is displayed, a grayscale voltage for 1 grayscale is approximately 5 mV, and when voltage fluctuation of a pixel is 16.6 mV, this corresponds to a grayscale voltage for 4 grayscales and thus influence of voltage fluctuation due to off current cannot be ignored. Consequently, not only characteristics of an on state (such as on current and field-effect mobility) but also influence of off current of a transistor included in a display panel must be considered.

It is an object of one embodiment of the present invention to provide a display device including a transistor having stable electric characteristics (e.g., an off current is extremely reduced).

One embodiment of the present invention provides a display device having high image quality by using a transistor whose off current is reduced to an extremely low level. In order to reduce off current of a transistor, a semiconductor material whose width of a forbidden band (a band gap) is greater than that of a silicon semiconductor is used for forming a transistor, and the concentration of an impurity which serves as a carrier donor of the semiconductor material is reduced, in one embodiment of the present invention. Therefore, an oxide semiconductor whose energy gap is greater than or equal to 2 eV, preferably greater than or equal to 2.5 eV, more preferably greater than or equal to 3 eV is used for a semiconductor layer of a transistor (a layer forming a channel formation region) to reduce the concentration of an impurity which serves as a carrier donor in the oxide semiconductor. Consequently, the off current of the transistor per micrometer in channel width can be reduced to lower than 10 zA/μm at room temperature and lower than 100 zA/μm at 85° C., which is an extremely low level.

One embodiment of the present invention is a display device including a display panel which displays an image and in which pixels are arranged in matrix. Each pixel includes one or more units each of which includes the following components: a transistor in which an oxide semiconductor layer is provided to overlap with a gate electrode with a gate insulating layer interposed; a pixel electrode which drives liquid crystal and is connected to a source side or a drain side of the transistor; a counter electrode provided to face the pixel electrode; and a liquid crystal layer provided between the pixel electrode and the counter electrode. The off current of the transistor per micrometer in channel width is lower than 10 zA/μm at room temperature and lower than 100 zA/μm at 85° C. In this display device, a storage capacitor which is normally provided so as to be connected to the pixel electrode for driving the liquid crystal and provided in parallel to the liquid crystal layer can be omitted. Alternatively, a storage capacitor may be provided appropriately.

Note that a source electrode and a drain electrode of the transistor may contain a metal nitride. A gate electrode of the transistor may be provided on a lower side (a substrate side), an upper side (the side opposite to the substrate side), or both sides of the oxide semiconductor layer with an insulating layer interposed therebetween. Further, the transistor whose maximum field-effect mobility is greater than or equal to 5 $cm^2/Vsec$, preferably 10 $cm^2/Vsec$ to 150 $cm^2/Vsec$ in an on state is used. This is because by increasing the operation speed of the transistor, writing operation or the like can be performed rapidly even when density of a pixel is increased.

According to one embodiment of the present invention, a signal voltage applied to a pixel can be held stably by using a transistor whose off current is satisfactorily reduced. Consequently, a signal input to the pixel can be kept in a given state (the state in which an image signal is written), so that an image can be displayed stably. By reducing voltage fluctuation of a pixel, multi-grayscale display can be easily carried out.

BEST MODE FOR CARRYING OUT THE INVENTION

Figure 1:
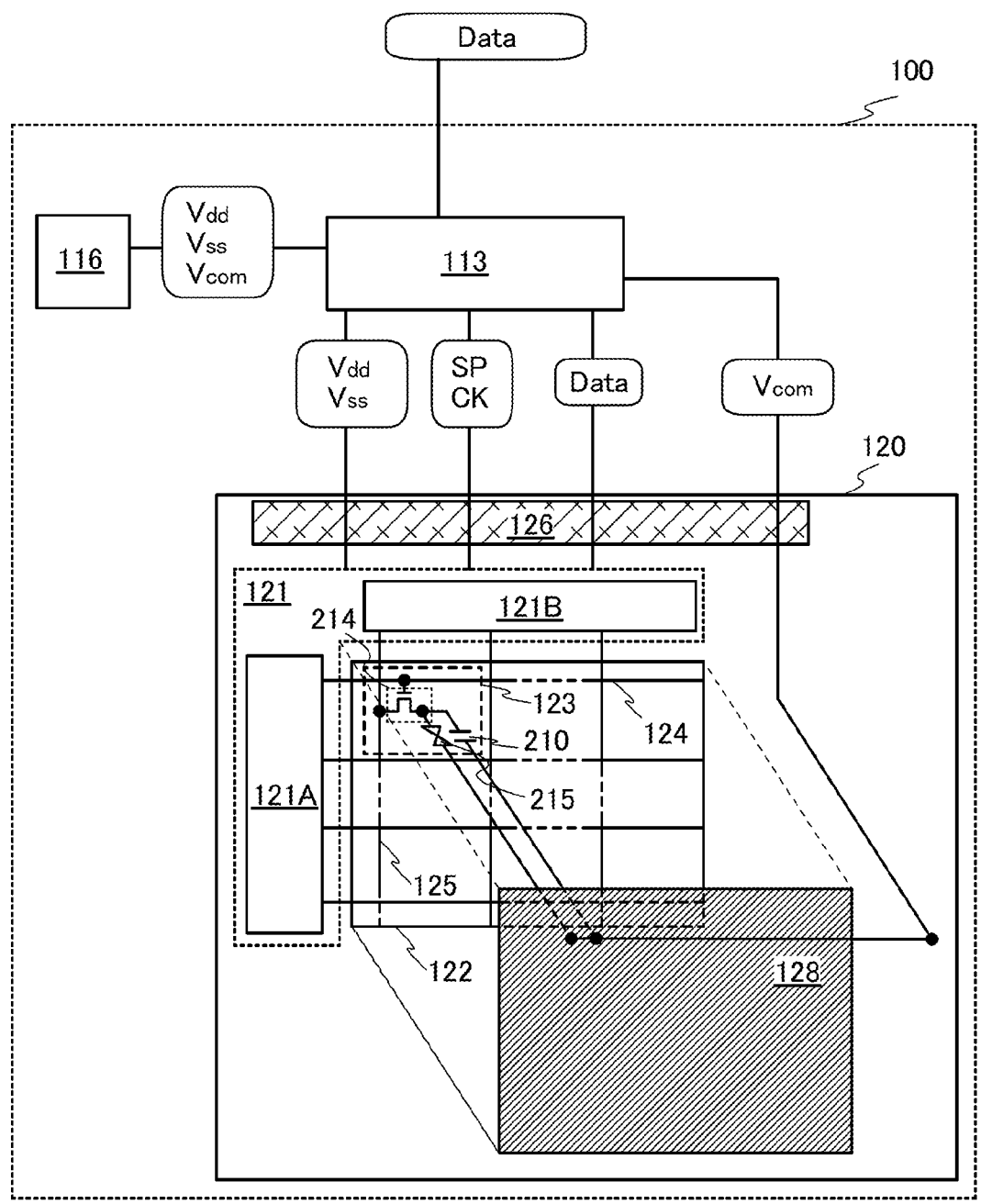
FIG. 1 is a block diagram illustrating a structure of a liquid crystal display device according to Embodiment 1.

Embodiments of the present invention are described below with reference to the accompanying drawings. However, the invention disclosed in this specification is not limited to the following description, and it is easily understood by those skilled in the art that modes and details can be variously changed without departing from the purpose and the scope of the present invention. Therefore, the invention disclosed in this specification should not be interpreted as being limited to the following description of the embodiments.

In the case where description is made with reference to drawings in embodiments, reference numerals are used to denote the same components in different drawings in some cases. Note that components illustrated in the drawings, that is, a thickness or a width of a layer, a region, or the like, a relative position, and the like are exaggerated in some cases for clarification in description of embodiments.

Embodiment 1

In this embodiment, one mode of a liquid crystal display device of the present invention is described with reference to FIG. 1.

An example of each component of a liquid crystal display device 100 shown in this embodiment is illustrated in a block diagram in FIG. 1. The liquid crystal display device 100 includes a power supply 116, a display control circuit 113, and a display panel 120. In the case of a transmissive liquid crystal display device or a transflective liquid crystal display device, a lighting unit (a backlight) portion may be further provided as a light source.

An image signal (an image signal Data) is supplied to the liquid crystal display device 100 from an external device which is connected to the liquid crystal display device 100. Note that power supply potential (high power supply potential $V_{dd}$, low power supply potential $V_{ss}$, and common potential $V_{com}$) is supplied by turning on the power supply 116 of the liquid crystal display device and starting supplying power, and a control signal (a start pulse SP and a clock signal CK) is supplied by the display control circuit 113.

Note that the high power supply potential $V_{dd}$ is potential higher than reference potential, and the low power supply potential $V_{ss}$ is potential lower than or equal to the reference potential. It is preferable that both the high power supply potential $V_{dd}$ and the low power supply potential $V_{ss}$ have such a level as to allow a transistor to operate. The high power supply potential $V_{dd}$ and the low power supply potential $V_{ss}$ are correctively referred to as a power supply voltage in some cases.

The common potential $V_{com}$ may be any potential as long as it serves as a fixed potential to be a reference with respect to the potential of an image signal supplied to a pixel electrode. For example, the common potential may be ground potential.

The image signal Data may be appropriately inverted in accordance with dot inversion driving, source line inversion driving, gate line inversion driving, frame inversion driving, or the like to be supplied to the liquid crystal display device 100. In the case where the image signal is an analog signal, it may be converted to a digital signal through an A/D converter or the like to be supplied to the liquid crystal display device 100.

In this embodiment, the common potential $V_{com}$ which is a fixed potential is supplied from the power supply 116 to one electrode of a common electrode 128 and one electrode of a capacitor 210 through the display control circuit 113.

The display control circuit 113 supplies a display panel image signal (Data), a control signal (specifically, a signal for controlling a supply or a stop of the control signal such as a start pulse SP and a clock signal CK), and power supply potential (high power supply potential $V_{dd}$, low power supply potential $V_{ss}$, and common potential $V_{com}$) to the display panel 120.

The display panel 120 includes a liquid crystal element 215 between a pair of substrates (a first substrate and a second substrate), and a driver circuit portion 121 and a pixel portion 122 are provided over the first substrate. The second substrate is provided with a common connection portion (also referred to as a common contact) and the common electrode 128 (also referred to as a counter electrode). Note that the first substrate and the second substrate are electrically connected to each other through the common connection portion; therefore, the common connection portion may be provided over the first substrate.

A plurality of gate lines 124 (scan lines) and a plurality of source lines 125 (signal lines) are provided in the pixel portion 122 and a plurality of pixels 123 are provided in matrix so that the pixels are surrounded by the gate lines 124 and the source lines 125. Note that in the display panel illustrated in this embodiment, the gate lines 124 are extended from a gate line driver circuit 121A and the source lines 125 are extended from a source line driver circuit 121B.

The pixel 123 includes a transistor 214 functioning as a switching element, a capacitor 210 connected to the transistor 214, and a liquid crystal element 215 connected to the transistor 214.

The liquid crystal element 215 is an element which controls transmission or non-transmission of light utilizing an optical modulation action of liquid crystal. The optical modulation action of liquid crystal is controlled by an electric field applied to the liquid crystal. A direction of the electric field applied to the liquid crystal depends on a liquid crystal material, a driving method, and an electrode structure and can be selected as appropriate. For example, in the case where a driving method in which an electric field is applied in a direction of a thickness of a liquid crystal layer (so-called a perpendicular direction) is used, a pixel electrode and a common electrode are provided on the first substrate and the second substrate respectively, so that the liquid crystal is interposed between the first substrate and the second substrate. In the case where a driving method in which an electric field is applied in an in-plane direction of a substrate (so-called a horizontal direction) to liquid crystal is used, a pixel electrode and a common electrode may be provided on the same substrate. The pixel electrode and the common electrode may have a variety of opening patterns. There is no particular limitation on a liquid crystal material, a driving method, and an electrode structure in this embodiment as long as the liquid crystal element controls transmission or non-transmission of light by the optical modulation action.

A gate electrode of the transistor 214 is connected to one of a plurality of the gate lines 124 provided in the pixel portion 122, one of a source electrode and a drain electrode of the transistor 214 is connected to one of a plurality of the source line 125, and the other of the source electrode and the drain electrode of the transistor 214, one of electrodes of the capacitor 210, and one electrode (a pixel electrode) of the liquid crystal element 215 are connected to one another.

A transistor whose off current is reduced is preferably used for the transistor 214. When the transistor 214 is off, electrical charges accumulated in the liquid crystal element 215 and the capacitor 210 which are connected to the transistor 214 hardly leak through the transistor 214, and a state in which a signal is written before the transistor 214 is off can be stably held until a next signal is written. Consequently, a pixel 213 can be formed without using the capacitor 210.

With such a structure, the capacitor 210 can extremely stably hold a voltage applied to the liquid crystal element 215. Note that the electrode of the capacitor 210 may be connected to a capacitor line additionally provided.

The driver circuit portion 121 includes the gate line driver circuit 121A and the source line driver circuit 121B. The gate line driver circuit 121A and the source line driver circuit 121B are driver circuits for driving the pixel portion 122 including the plurality of pixels and each include a shift register circuit (also referred to as a shift register).

Note that the gate line driver circuit 121A and the source line driver circuit 121B may be formed over the same substrate as the pixel portion 122 or may be formed over a different substrate from the substrate where the pixel portion 122 is formed.

Note that high power supply potential Kid, low power supply potential $V_{ss}$, a start pulse SP, a clock signal CK, and an image signal Data which are controlled by the display control circuit 113 are supplied to the driver circuit portion 121.

A terminal portion 126 is an input terminal supplying predetermined signals (high power supply potential $V_{dd}$, low power supply potential $V_{ss}$, a start pulse SP, a clock signal CK, an image signal Data, common potential $V_{com}$, and the like) which are output from the display control circuit 113, to the driver circuit portion 121.

The common electrode 128 is electrically connected to a common potential line supplying common potential $V_{com}$ controlled by the display control circuit 113 through the common connection portion.

As a specific example of the common connection portion, a conductive particle in which an insulating sphere is covered with a metal thin film is interposed between the common electrode 128 and the common potential line, whereby the common electrode 128 and the common potential line can be electrically connected to each other. Note that two or more common connection portions may be provided in the display panel 120.

In addition, the liquid crystal display device may include a photometry circuit. The liquid crystal display device provided with the photometry circuit can detect brightness of the environment where the liquid crystal display device is set. Thus, the display control circuit 113 to which the photometry circuit is connected can control a driving method of a light source such as a backlight or a sidelight in accordance with a signal input from the photometry circuit.

Note that when color display is performed, display can be performed using a color filter. In addition, another optical film (such as a polarizing film, a retardation film, or an anti-reflection film) can be used. A light source such as a backlight used for a transmissive liquid crystal display device or a transflective liquid crystal display device may be used in accordance with usage of the liquid crystal display device 100, and for example, a cold cathode fluorescent lamp, a light-emitting diode (LED), or the like can be used. Further, a surface light source may be formed using a plurality of LED light sources, a plurality of electroluminescent (EL) light sources, or the like. As the surface light source, three or more kinds of LEDs may be used and an LED emitting white light may be used. Note that the color filter is not provided in the case where RGB light-emitting diodes or the like are arranged in a backlight and a successive additive color mixing method (a field sequential method) in which color display is performed by time division is employed.

Embodiment 2

In this embodiment, an example of an electronic device including the liquid crystal display device described in Embodiment 1 will be described.

Figure 2A:
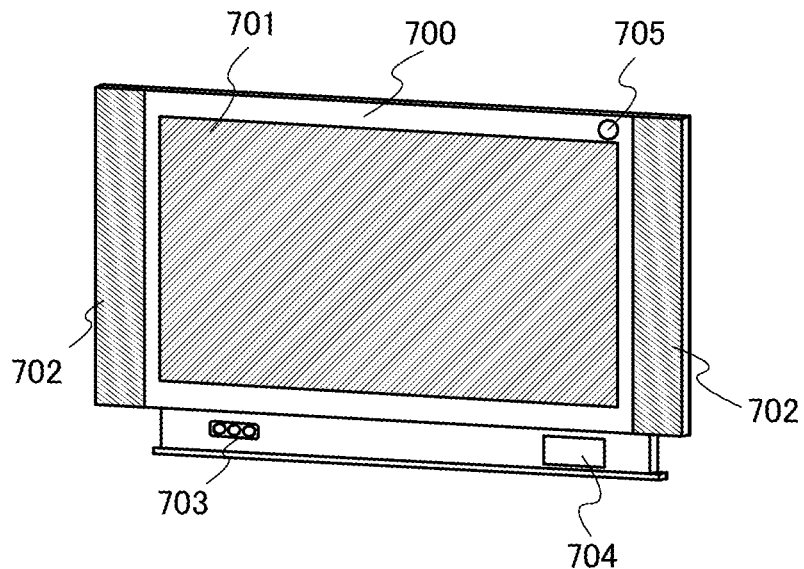
FIGS. 2A and 2B are diagrams illustrating a structure of a television receiver according to Embodiment 2.

FIG. 2A illustrates an external view of a television receiver which is an electronic device. FIG. 2A illustrates a housing 700 in which a display module 701 manufactured using the display panel described in Embodiment 1 is provided. The housing 700 includes a speaker 702, operation keys 703, an external connection terminal 704, an illuminance sensor 705, and the like.

The television receiver illustrated in FIG. 2A can display text information or a still image in addition to a moving image. A moving image can be displayed in a region of a display portion while a still image can be displayed in the other region. Note that a displayed still image includes characters, diagrams, signs, pictures, designs, and paintings or a combination of any of them. Alternatively, any of the displayed images which are colored is included.

Figure 2B:
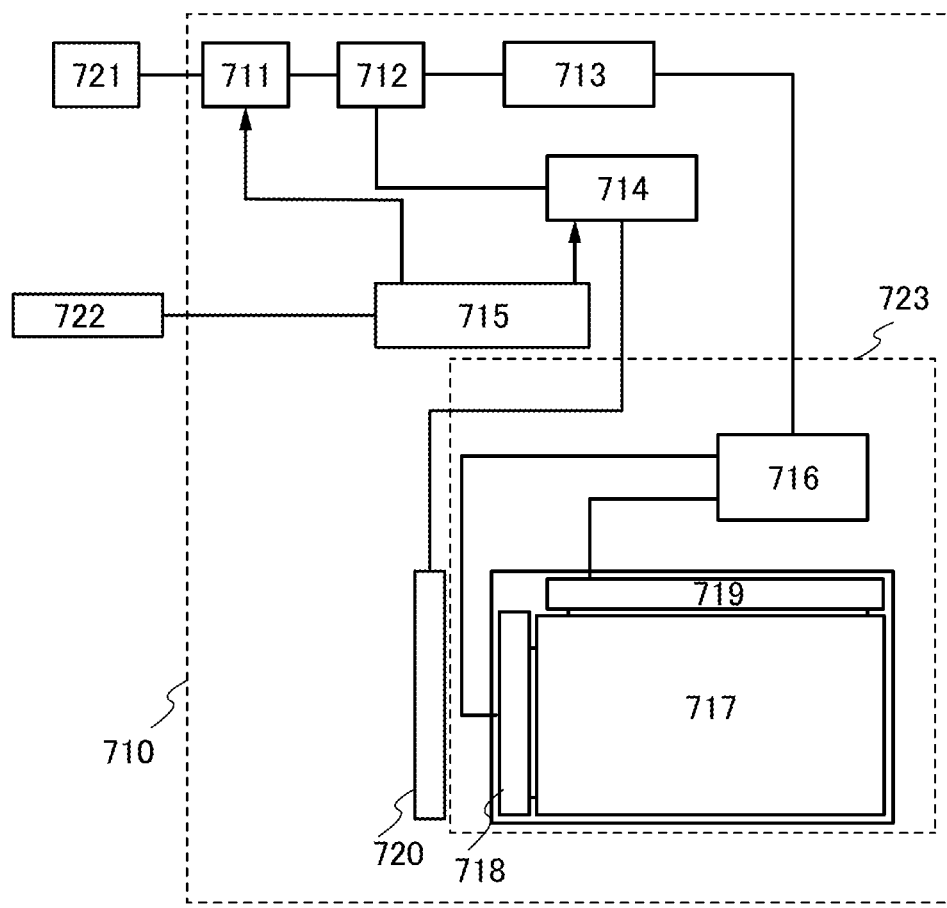

FIG. 2B shows a block diagram of a main structure of the television receiver. A television receiver 710 illustrated in FIG. 2B includes a tuner 711, a digital demodulation circuit 712, a video signal processing circuit 713, an audio signal processing circuit 714, a display adjusting circuit 715, a display control circuit 716, a display panel 717, a gate line driver circuit 718, a source line driver circuit 719, and a speaker 720.

The tuner 711 receives a video signal and an audio signal from an antenna 721. The digital demodulation circuit 712 demodulates a signal from the tuner 711 to a video signal and an audio signal of a digital signal. The video signal processing circuit 713 converts a video signal of a digital signal into a color signal corresponding to each color: red, green, and blue. The audio signal processing circuit 714 performs conversion of an audio signal of a digital signal into a signal which is output as the sound from the speaker 720, and the like. The display adjusting circuit 715 receives control information of a receiving station (receiving frequency) and sound volume from an external input portion 722 and transmits the signal to the tuner 711 or the audio signal processing circuit 714.

The display control circuit 716, the display panel 717, the gate line driver circuit 718, and the source line driver circuit 719 correspond to the display control circuit 113, the display panel 120, the gate line driver circuit 121A, and the source line driver circuit 121B described in Embodiment 1 respectively. That is, a dotted line portion 723 has a structure corresponding to the liquid crystal display device 100 described in Embodiment 1. Note that the video signal processing circuit 713 may also serve as the display control circuit 716.

Figure 3A:
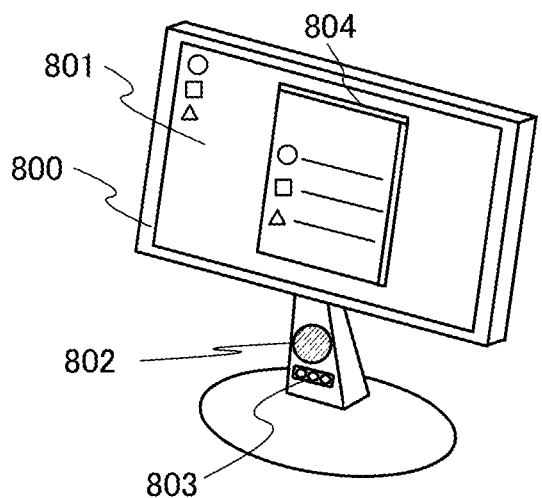
FIGS. 3A and 3B are diagrams illustrating a structure of a monitor according to Embodiment 3.

Next, FIG. 3A illustrates an external view of a monitor (also referred to as a PC monitor) used for an electronic calculator (a personal computer) which is an electronic device. FIG. 3A illustrates a housing 800 in which a display module 801 manufactured using the display panel described in Embodiment 1 is provided. The housing 800 includes a speaker 802, an external connection terminal 803, and the like. Note that in FIG. 3A, a window-type display portion 804 is illustrated to indicate that the monitor is a PC monitor.

In FIG. 3A, a structure of a PC monitor of a so-called desktop computer is illustrated but the PC monitor may also be a PC monitor of a laptop computer. Note that a display of the PC monitor includes still images such as characters, diagrams, signs, pictures, designs, and paintings or a combination any of them, or any of the still images which are colored, in addition to moving images.

Figure 3B:
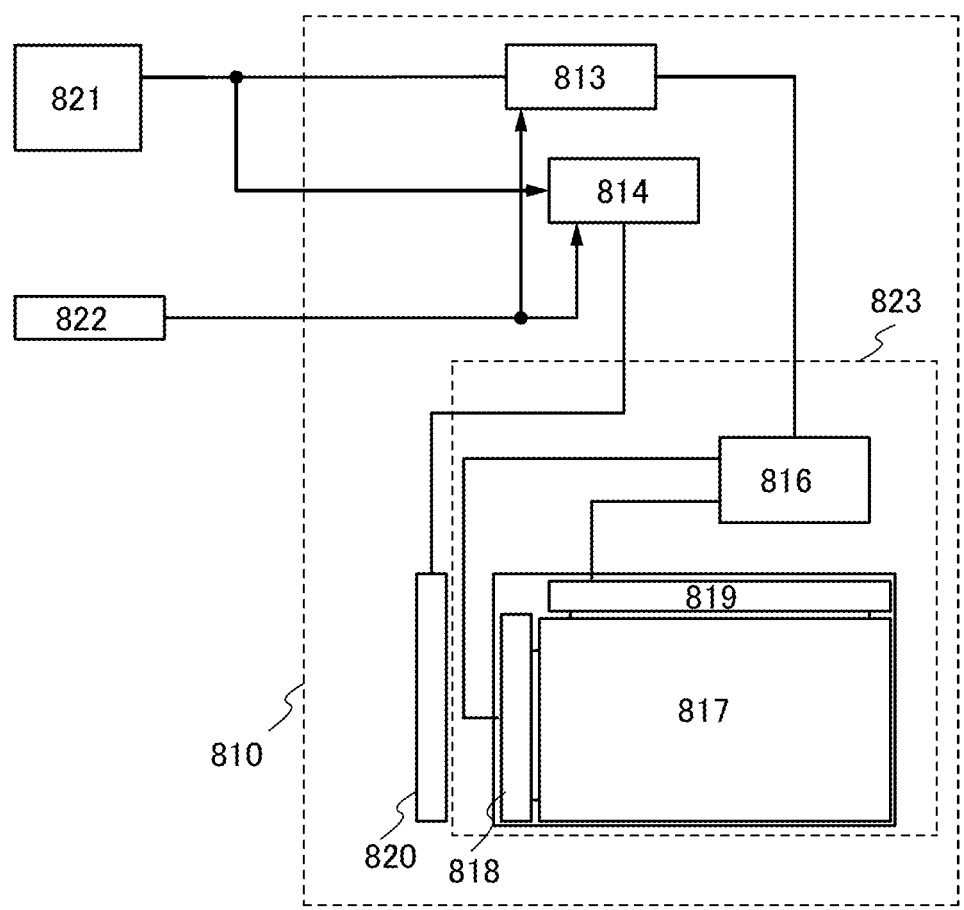

A block diagram of a main structure of a PC monitor is illustrated in FIG. 3B. A PC monitor 810 illustrated in FIG. 3B includes a video signal processing circuit 813, an audio signal processing circuit 814, a display control circuit 816, a display panel 817, a gate line driver circuit 818, a source line driver circuit 819, and a speaker 820.

The video signal processing circuit 813 converts a video signal from an external arithmetic circuit 821 such as a CPU into a color signal corresponding to each color: red, green, and blue. The audio signal processing circuit 814 performs conversion of an audio signal from the external arithmetic circuit 821 such as a CPU into a signal which is output as the sound from the speaker 820, and the like. A signal output from the video signal processing circuit 813 and the audio signal processing circuit 814 varies according to operation by an external operation means 822 such as a keyboard.

The display control circuit 816, the display panel 817, the gate line driver circuit 818, and the source line driver circuit 819 correspond to the display control circuit 113, the display panel 120, the gate line driver circuit 121A, and the source line driver circuit 121B described in Embodiment 1 respectively. That is, a dotted line portion 823 has a structure corresponding to the liquid crystal display device 100 described in Embodiment 1. Note that the video signal processing circuit 813 may also serve as the display control circuit 816.

This embodiment can be implemented in appropriate combination with the structures described in the other embodiments.

Embodiment 3

In this embodiment, description is made on a structure example of a backlight (a backlight portion, a backlight unit) which can be applied to a liquid crystal display device disclosed in this specification with reference to FIGS. 4A to 4C and FIGS. 5A to 5C.

Figure 4A:
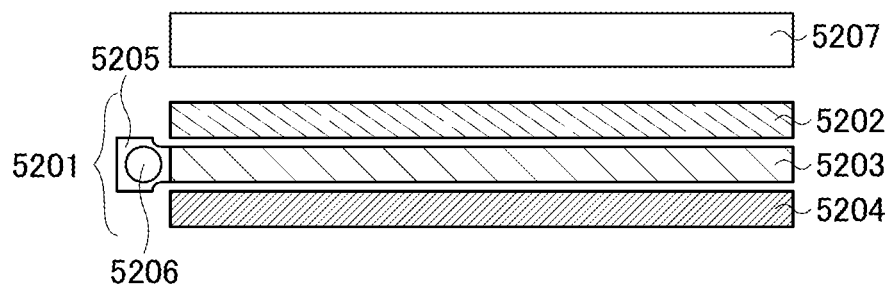
FIGS. 4A to 4C are diagrams each illustrating an example of a backlight of a liquid crystal display device.

FIG. 4A illustrates an example of a liquid crystal display device including a so-called edge-light type backlight portion 5201 and a display panel 5207. An edge-light type corresponds to a type in which a light source is provided at an end of a backlight portion and light of the light source is emitted from the entire light-emitting surface.

The backlight portion 5201 includes a diffusion plate 5202 (also referred to as a diffusion sheet), a light guide plate 5203, a reflection plate 5204, a lamp reflector 5205, and a light source 5206. Note that the backlight portion 5201 may also include a luminance improvement film or the like.

The light source 5206 has a function of emitting light as necessary. For example, for the light source 5206, a cold cathode fluorescent lamp (CCFL), a light emitting diode, an EL element, or the like is used.

Figure 4B:
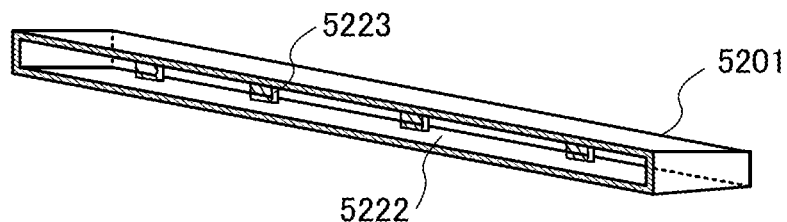

FIG. 4B is a diagram illustrating a detailed structure of an edge-light type backlight portion. Note that description of a diffusion plate, a light guide plate, a reflection plate, and the like is omitted.

A backlight portion 5201 illustrated in FIG. 4B has a structure in which light-emitting diodes (LEDs) 5223 are used as light sources. For example, the light-emitting diodes (LEDs) 5223 which emit white light are provided at a certain interval. In addition, a lamp reflector 5222 is provided to reflect light from the light-emitting diodes (LEDs) 5223 efficiently. Note that in the case where display is performed in combination with a field-sequential method, light-emitting diodes (LEDs) of each color of RGB are used as light sources.

Figure 4C:
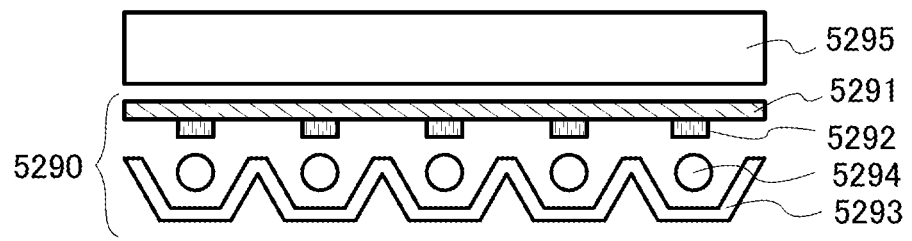

FIG. 4C shows an example of a liquid crystal display device including a so-called direct-type backlight portion and a liquid crystal panel. A direct type corresponds to a type in which a light source is provided directly under a light-emitting surface and light of the light source is emitted from the entire light-emitting surface.

A backlight portion 5290 includes a diffusion plate 5291, a light-shielding portion 5292, a lamp reflector 5293, a light source 5294, and a liquid crystal panel 5295.

The light source 5294 has a function of emitting light as necessary. For example, for the light source 5294, a cold cathode fluorescent lamp, a light-emitting diode, an EL element which is a light-emitting element (e.g., an organic electroluminescence element), or the like is used.

Note that in the so-called direct-type backlight portion, the thickness of the backlight portion can be reduced with use of an EL element as a light source. An example of a backlight portion using an EL element is illustrated in FIG. 5A.

Figure 5A:
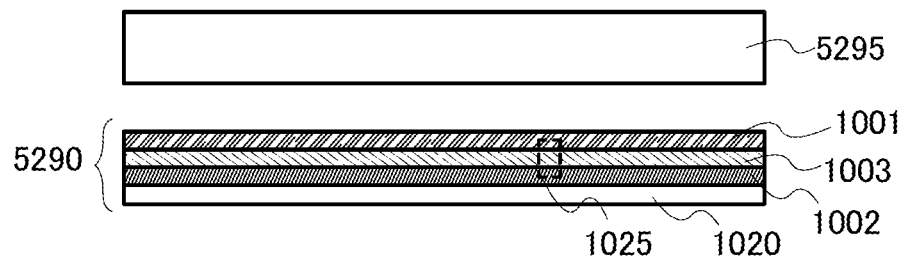
FIGS. 5A to 5C are diagrams illustrating examples of a backlight of a liquid crystal display device.

A backlight portion 5290 illustrated in FIG. 5A includes an EL element 1025 provided over a substrate 1020. The EL element 1025 has a structure in which an EL layer 1003 including a light-emitting region is sandwiched between a pair of electrodes (an anode 1001 and a cathode 1002). Note that a substrate, a protective film, or the like may be provided to cover the EL element 1025 so that the EL element 1025 may be sealed.

In this embodiment, since light from the EL layer 1003 is emitted to the display panel 5295 through the anode 1001, the anode 1001 may include a material which transmits light such as an indium tin oxide (ITO). The cathode 1002 may include a material which reflects light such as an aluminum film.

Figure 5B:
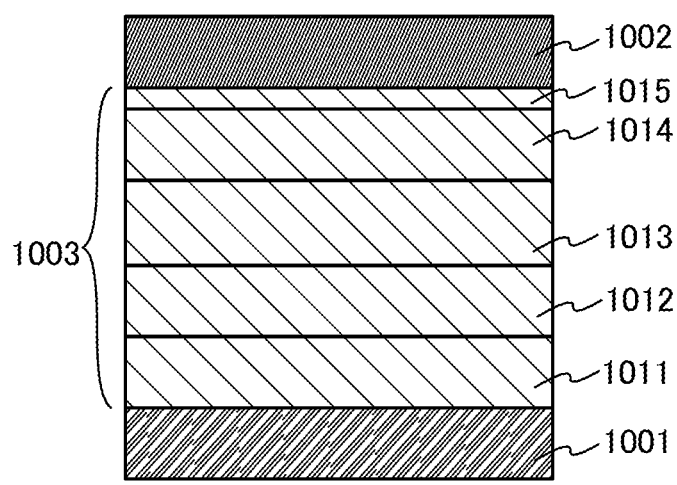
Figure 5C:
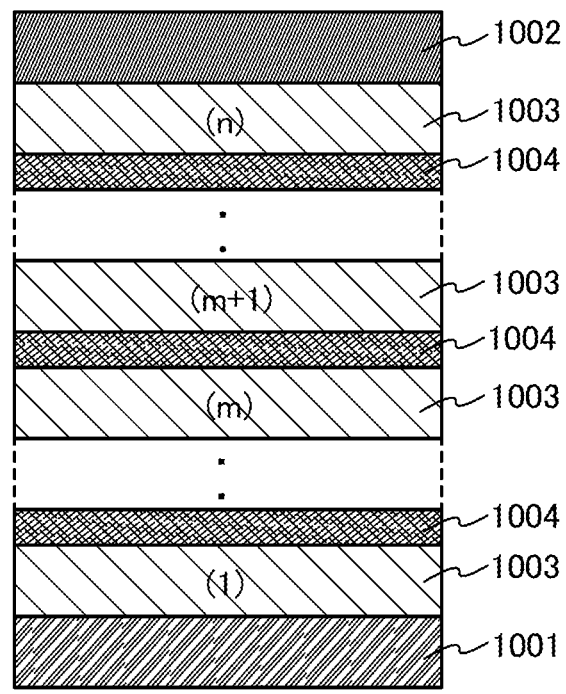

Examples of element structures of the EL element 1025 in FIG. 5A are illustrated in FIGS. 5B and 5C.

The EL layer 1003 may include at least a light-emitting layer 1013, and may have a stacked-layer structure including a functional layer other than the light-emitting layer 1013. As the functional layer other than the light-emitting layer 1013, a layer containing a substance having a high hole-injection property, a substance having a high hole-transport property, a substance having a high electron-transport property, a substance having a high electron-injection property, a bipolar substance (a substance having high electron and hole transport properties), or the like can be used. Specifically, functional layers such as a hole-injection layer 1011, a hole-transport layer 1012, the light-emitting layer 1013, an electron-transport layer 1014, and an electron-injection layer 1015 can be used as appropriate in combination.

Next, materials that can be used for the above-described EL element 1025 are specifically described.

The anode 1001 is preferably made of a metal, an alloy, an electrically conductive compound, a mixture thereof, or the like that has a high work function (specifically, a work function of 4.0 eV or higher is preferable). Specifically, for example, a conductive metal oxide such as indium oxide-tin oxide (ITO: indium tin oxide), indium oxide-tin oxide containing silicon or silicon oxide, indium oxide-zinc oxide (IZO: indium zinc oxide), or indium oxide containing tungsten oxide and zinc oxide can be given.

Films of these conductive metal oxides are usually formed by sputtering; however, a sol-gel method or the like may also be used. For example, indium oxide-zinc oxide (IZO) can be formed by a sputtering method using indium oxide into which 1 wt % to 20 wt % zinc oxide is added, as a target. Indium oxide containing tungsten oxide and zinc oxide can be formed by a sputtering method using indium oxide into which 0.5 wt % to 5 wt % of tungsten oxide and 0.1 wt % to 1 wt % of zinc oxide are added, as a target.

Besides, as a material used for the anode 1001, it is also possible to use gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (such as titanium nitride), molybdenum oxide, vanadium oxide, ruthenium oxide, tungsten oxide, manganese oxide, titanium oxide, or the like.

The cathode 1002 can be made of a metal, an alloy, an electrically conductive compound, a mixture thereof, or the like that has a low work function (specifically, a work function lower than or equal to 3.8 eV is preferable). As a specific example of such a cathode material, an element belonging to Group 1 or Group 2 in the periodic table, i.e., an alkali metal such as lithium (Li) or cesium (Cs), or an alkaline earth metal such as magnesium (Mg), calcium (Ca), or strontium (Sr); an alloy containing any of these metals (such as MgAg or AlLi); a rare earth metal such as europium (Eu) or ytterbium (Yb); an alloy containing any of such a rare earth metal; or the like can be used. Note that a film of an alkali metal, an alkaline earth metal, or an alloy thereof can be formed by a vacuum evaporation method. An alloy of an alkali metal or an alkaline earth metal can also be formed by a sputtering method. Further, a silver paste or the like can be formed by an inkjet method or the like.

In addition, the cathode 1002 can be formed by a stack of a thin film of an alkali metal compound, an alkaline earth metal compound, or a rare earth metal compound (e.g., lithium fluoride (LiF), lithium oxide (LiO$_x$), cesium fluoride (CsF), calcium fluoride (CaF$_2$), or erbium fluoride (ErF$_3$)) and a film of a metal such as aluminum.

Next, specific examples of materials used for forming each of layers included in the EL layer 1003 are described below.

The hole-injection layer 1011 is a layer including a substance having a high hole-injection property. As the substance having a high hole-injection property, for example, molybdenum oxide, vanadium oxide, ruthenium oxide, tungsten oxide, manganese oxide, or the like can be used. Alternatively, the hole-injection layer 1011 can be formed using a phthalocyanine-based compound such as phthalocyanine (abbreviation: H$_2$Pc) or copper phthalocyanine (abbreviation: CuPc); an aromatic amine compound such as 4,4'-bis[N-(4-diphenylaminophenyl)-N-phenylamino]biphenyl (abbreviation: DPAB) or N,N'-bis[4-[bis(3-methylphenyl)amino]phenyl]-N,N'-diphenyl-[1,1'-biphenyl]-4,4'-diamine (abbreviation: DNTPD); a high molecular compound such as poly(3,4-ethylenedioxythiophene)/poly(styrenesulfonic acid) (PEDOT/PSS), or the like. Further, the hole-injection layer 1011 can be formed using a tris(p-enamine-substituted-aminophenyl)amine compound, a 2,7-diamino-9-fluorenylidene compound, a tri(p-N-enamine-substituted-aminophenyl)benzene compound, a pyrene compound having one or two ethenyl groups having at least one aryl group, N,N'-di(biphenyl-4-yl)-N,N'-diphenylbiphenyl-4,4'-diamine, N,N,N',N'-tetra(biphenyl-4-yl)biphenyl-4,4'-diamine, N,N,N',N'-tetra(biphenyl-4-yl)-3,3'-diethylbiphenyl-4,4'-diamine, 2,2'-(methylenedi-4,1-phenylene)bis[4,5-bis(4-methoxyphenyl)-2H-1,2,3-triazole], 2,2'-(biphenyl-4,4'-diyl)bis(4,5-diphenyl-2H-1,2,3-triazole), 2,2'-(3,3'-dimethylbipheny-4,4'-diyl)bis(4,5-diphenyl-2H-1,2,3-triazole), bis[4-(4,5-diphenyl-2H-1,2,3-triazol-2-yl)phenyl](methyl)amine, or the like.

The hole-injection layer 1011 can also be formed of a hole-injection composite material including an organic compound and an inorganic compound (preferably, an inorganic compound having an electron-accepting property to an organic compound). Since electrons are transferred between the organic compound and the inorganic compound, the hole-injection composite material has a high carrier density, and thus has an excellent hole-injection property and a hole-transport property.

In the case where the hole-injection layer 1011 is made of a hole-injection composite material, the hole-injection layer 1011 can form an ohmic contact with the anode 1001; thus, the material of the anode 1001 can be selected regardless of the work function.

The inorganic compound used for the hole-injection composite material is preferably an oxide of a transition metal. In addition, an oxide of metals that belong to Group 4 to Group 8 in the periodic table can be given. Specifically, vanadium oxide, niobium oxide, tantalum oxide, chromium oxide, molybdenum oxide, tungsten oxide, manganese oxide, and rhenium oxide are preferable since their electron-accepting properties are high. Among them, use of molybdenum oxide is especially preferable since it is stable in the air, has a low hygroscopic property, and is easily treated.

As the organic compound used for the hole-injection composite material, it is possible to use various compounds such as an aromatic amine compound, a carbazole derivative, an aromatic hydrocarbon, and a high molecular compound (oligomer, dendrimer, polymer, or the like). Note that the organic compound used for the hole-injection composite material is preferably an organic compound with a high hole-transport property. Specifically, a substance having a hole mobility greater than or equal to $10^{-6}$ cm$^2$/Vs is preferably used. Note that substances other than the above described materials may also be used as long as the substances in which a hole-transport property is higher than an electron-transport property. The organic compounds that can be used for the hole-injection composite material are specifically described below.

As aromatic amine compounds, for example, there are N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis[4-[bis(3-methylphenyl)amino]phenyl]-N,N'-diphenyl-[1,1'-biphenyl]-4,4'-diamine (abbreviation: DNTPD), 1,3,5-tris[N-(4-diphenylaminophenyl)-N-phenylamino]benzene (abbreviation: DPA3B), and the like.

Specific examples of the carbazole derivative used for the hole-injection composite material include: 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like.

Moreover, 4,4'-di(N-carbazolyl)biphenyl (abbreviation: CBP); 1,3,5-tris[4-(N-carbazolyl)phenyl]benzene (abbreviation: TCPB); 9-[4-(N-carbazolyl)]phenyl-10-phenylanthracene (abbreviation: CzPA); 1,4-bis[4-(N-carbazolyl)phenyl]-2,3,5,6-tetraphenylbenzene; or the like can also be used.

Examples of the aromatic hydrocarbon used for the hole-injection composite material include: 2-tert-butyl-9,10-di(2-naphthyl)anthracene (abbreviation: t-BuDNA); 2-tert-butyl-9,10-di(1-naphthyl)anthracene; 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 2-tert-butyl-9,10-bis[2-(1-naphthyl)phenyl]anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides those, pentacene, coronene, or the like can also be used. In particular, the aromatic hydrocarbon having a hole mobility greater than or equal to $1\times10^{-6}$ cm$^2$/Vs and having 14 to 42 carbon atoms is particularly preferable.

Note that the aromatic hydrocarbon used for the hole-injection composite material may have a vinyl skeleton. As the aromatic hydrocarbon having a vinyl group, the following are given for example: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

In addition, a high molecular compound such as poly(N-vinylcarbazole) (abbreviation: PVK) or poly(4-vinyltriphenylamine) (abbreviation: PVTPA) can also be used.

The hole-transport layer 1012 includes a substance having a high hole-transport property. As the substance having a high hole-transport property, for example, an aromatic amine compound (that is, a compound having a benzene ring-nitrogen bond) is preferable. As examples of the material which are widely used, the following can be given: 4,4'-bis[N-(3-methylphenyl)-N-phenylamino]biphenyl; a derivative thereof such as 4,4'-bis[N-(1-napthyl)-N-phenylamino]biphenyl (hereinafter referred to as NPB); and a starburst aromatic amine compound such as 4,4',4''-tris(N,N-diphenyl-amino) triphenylamine, 4,4',4''-tris[N-(3-methylphenyl)-N-phenylamino]triphenylamine, and the like. The substances mentioned here are mainly ones that have a hole mobility higher than or equal to $10^{-6}$ cm$^2$/Vs. Note that substances other than the above described materials may also be used as long as the substances have a higher hole-transport property than an electron-transport property. The hole-transport layer 1012 is not limited to a single layer, and may be a mixed layer of the aforementioned substances or a stacked layer of two or more layers each including the aforementioned substance.

Alternatively, a material with a hole-transport property may be added to a high molecular compound that is electrically inactive, such as PMMA.

Further alternatively, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), or poly[N,N'-bis(4-butylphenyl)-N,N'-bis(phenyl)benzidine (abbreviation: Poly-TPD) may be used, and further, the material with a hole-transport property may be added to the above high molecular compound, as appropriate. Further, the hole-transport layer 1012 can be formed using a tris(p-enamine-substituted-aminophenyl)amine compound, a 2,7-diamino-9-fluorenylidene compound, a tri(p-N-enamine-substituted-aminophenyl)benzene compound, a pyrene compound having one or two ethenyl groups having at least one aryl group, N,N'-di(biphenyl-4-yl)-N,N'-diphenylbiphenyl-4,4'-diamine, N,N,N',N'-tetra(biphenyl-4-yl)biphenyl-4,4'-diamine, N,N,N',N'-tetra(biphenyl-4-yl)-3,3'-diethylbiphenyl-4,4'-diamine, 2,2'-(methylenedi-4,1-phenylene)bis[4,5-bis(4-methoxyphenyl)-2H-1,2,3-triazole], 2,2'-(biphenyl-4,4'-diyl)bis(4,5-diphenyl-2H-1,2,3-triazole), 2,2'-(3,3'-dimethylbipheny-4,4'-diyl)bis(4,5-diphenyl-2H-1,2,3-triazole), bis[4-(4,5-diphenyl-2H-1,2,3-triazol-2-yl)phenyl] (methyl)amine, or the like.

The light-emitting layer 1013 is a layer including a light-emitting substance and can be formed using a variety of materials. For example, as a light-emitting substance, a fluorescent compound which emits fluorescence or a phosphorescent compound which emits phosphorescence can be used. Organic compound materials which can be used for the light-emitting layer are described below. Note that materials which can be used for the EL element 1025 are not limited to these materials.

Blue to blue-green light emission can be obtained, for example, by using perylene, 2,5,8,11-tetra-t-butylperylene (abbreviation: TBP), 9,10-diphenylanthracene, or the like as a guest material, and dispersing the guest material in a suitable host material. Alternatively, the blue to blue-green light emission can be obtained from a styrylarylene derivative such as 4,4'-bis(2,2-diphenylvinyl)biphenyl (abbreviation:

DPVBi), or an anthracene derivative such as 9,10-di-2-naphthylanthracene (abbreviation: DNA) or 9,10-bis(2-naphthyl)-2-t-butylanthracene (abbreviation: t-BuDNA). Further, a polymer such as poly(9,9-dioctylfluorene) may be used. Further, as a guest material for blue light emission, a styrylamine derivative is preferable. Examples which can be given include N,N'-bis[4-(9H-carbazol-9-yl)phenyl]-N,N'-diphenylstilbene-4,4'-diamine (abbreviation: YGA2S), N,N'-diphenyl-N,N'-bis(9-phenyl-9H-carbazol-3-yl)stilbene-4,4'-diamine (abbreviation: PCA2S), and the like. In particular, YGA2S is preferable because it has a peak at around 450 nm. Further, as a host material, an anthracene derivative is preferable; 9,10-bis(2-naphthyl)-2-t-butylanthracene (abbreviation: t-BuDNA) or 9-[4-(10-phenyl-9-anthryl)phenyl]-9H-carbazole (abbreviation: CzPA) is suitable. In particular, CzPA is preferable because it is electrochemically stable.

Blue-green to green light emission can be obtained, for example, by using a coumarin dye such as coumarin 30 or coumarin 6, bis[2-(2,4-difluorophenyl)pyridinato](picolinate)iridium (abbreviation: FIrpic), bis(2-phenylpyridinato)(acetylacetonato)iridium (abbreviation: Ir(ppy)$_2$(acac)), or the like as a guest material and dispersing the guest material in a suitable host material. Further, blue-green to green light emission can be obtained by dispersing perylene or TBP, which are mentioned above, in a suitable host material at a high concentration greater than or equal to 5 wt %. Further alternatively, the blue-green to green light emission can be obtained from a metal complex such as BAlq, Zn(BTZ)$_2$, or bis(2-methyl-8-quinolinolato)chlorogallium (Ga(mq)$_2$Cl). Further, a polymer such as poly(p-phenylenevinylene) may be used. An anthracene derivative is preferable as a guest material of a blue-green to green light-emitting layer, as high light-emitting efficiency can be obtained when an anthracene derivative is used. For example, when 9,10-bis{4-[N-(4-diphenylamino)phenyl-N-phenyl]aminophenyl}-2-tert-butylanthracene (abbreviation: DPABPA) is used, highly efficient blue-green light emission can be obtained. In addition, an anthracene derivative in which an amino group has been substituted into the 2-position is preferable, as highly efficient green light emission can be obtained with such an anthracene derivative. In particular, N-(9,10-diphenyl-2-anthryl)-N,9-diphenyl-9H-carbazol-3-amine (abbreviation: 2PCAPA) is suitable, as it has a long life. As a host material for these materials, an anthracene derivative is preferable; CzPA, which is mentioned above, is preferable, as it is electrochemically stable. In the case where the EL element 1025 having two peaks in the blue to green wavelength range is manufactured by combining green light emission and blue light emission, an anthracene derivative having an electron-transport property, such as CzPA, is preferably used as a host material for a blue-light-emitting layer and an aromatic amine compound having a hole-transport property, such as NPB, is preferably used as a host material for a green-light-emitting layer, so that light emission can be obtained at the interface between the blue-light-emitting layer and the green-light-emitting layer. That is, in such a case, an aromatic amine compound like NPB is preferable as a host material of a green light-emitting material such as 2PCAPA.

Yellow to orange light emission can be obtained, for example, by using rubrene, 4-(dicyanomethylene)-2-[p-(dimethylamino)styryl]-6-methyl-4H-pyran (abbreviation: DCM1), 4-(dicyanomethylene)-2-methyl-6-(9-julolidyl)ethenyl-4H-pyran (abbreviation: DCM2), bis[2-(2-thienyl)pyridinato]acetylacetonatoiridium (abbreviation: Ir(thp)$_2$(acac)), bis(2-phenylquinolinato)acetylacetonatoiridium (abbreviation: Ir(pq)$_2$(acac)), or the like as a guest material and dispersing the guest material in a suitable host material.

In particular, a tetracene derivative such as rubrene is preferable as a guest material because it is highly efficient and chemically stable. As a host material in this case, an aromatic amine compound such as NPB is preferable. Alternatively, a metal complex such as bis(8-quinolinolato)zinc(II) (abbreviation: Znq$_2$), bis[2-cinnamoyl-8-quinolinolato]zinc (abbreviation: Znsq$_2$), or the like can be used as a host material. Further alternatively, a polymer, such as poly(2,5-dialkoxy-1,4-phenylenevinylene) may be used.

Orange to red light emission can be obtained, for example, by using 4-(dicyanomethylene)-2,6-bis[p-(dimethylamino)styryl]-4H-pyran (abbreviation: BisDCM), 4-(dicyanomethylene)-2,6-bis[2-(julolidin-9-yl)ethenyl]-4H-pyran (abbreviation: BisDCJ), 4-(dicyanomethylene)-2-methyl-6-(9-julolidyl)ethenyl-4H-pyran (abbreviation: DCM2), bis[2-(2-thienyl)pyridinato]acetylacetonatoiridium (abbreviation: Ir(thp)$_2$(acac)), or the like as a guest material and dispersing the guest material in a suitable host material. Orange to red light emission can also be obtained by using a metal complex such as bis(8-quinolinolato)zinc(II) (abbreviation: Znq$_2$), bis[2-cinnamoyl-8-quinolinolato]zinc (abbreviation: Znsq$_2$), or the like. Further, a polymer such as poly(3-alkylthiophene) may be used. As a guest material which exhibits red light emission, a 4H-pyran derivative such as 4-(dicyanomethylene)-2,6-bis[p-(dimethylamino)styryl]-4H-pyran (abbreviation: BisDCM), 4-(dicyanomethylene)-2,6-bis[2-(julolidin-9-yl)ethenyl]-4H-pyran (abbreviation: BisDCJ), 4-(dicyanomethylene)-2-methyl-6-(9-julolidyl)ethenyl-4H-pyran (abbreviation: DCM2), {2-isopropyl-6-[2-(2,3,6,7-tetrahydro-1,1,7,7-tetramethyl-1H,5H-benzo[ij]quinolizin-9-yl)ethenyl]-4H-pyran-4-ylidene}propanedinitrile (abbreviation: DCJTI), or {2,6-bis[2-(2,3,6,7-tetrahydro-8-methoxy-1,1,7,7-tetramethyl-1H,5H-benzo[ij]quinolizin-9-yl)ethenyl]-4H-pyran-4-ylidene}propanedinitrile (abbreviation: BisDCJTM) is preferably used because of its high efficiency. In particular, DCJTI and BisDCJTM are preferable, as they have a light emission peak at around 620 nm.

Note that the light-emitting layer 1013 may have a structure in which the above substance having a light-emitting property (a guest material) is dispersed in another substance (a host material). As the substance with which the substance having a high light-emitting property is dispersed, various kinds of materials can be used, and it is preferable to use a substance whose lowest unoccupied molecular orbital (LUMO) level is higher than that of a substance having a high light-emitting property and whose highest occupied molecular orbital (HOMO) level is lower than that of the substance having a high light-emitting property.

As the substance with which the substance having a light-emitting property is dispersed, specifically, a metal complex such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq$_2$), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), or bathocuproine (abbreviation: BCP); a condensed aromatic compound such as 9-[4-

(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3), 9,10-diphenylanthracene (abbreviation: DPAnth), or 6,12-dimethoxy-5,11-diphenylchrysene; an aromatic amine compound such as N,N-dipheyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, or BSPB; or the like can be used.

As a substance with which the substance having a light-emitting property is dispersed, a plurality of kinds of substances can be used. For example, in order to suppress crystallization, a substance such as rubrene which suppresses crystallization, may be further added. In addition, NPB, Alq, or the like may be further added in order to efficiently transfer energy to the substance having a light-emitting property.

When a structure in which the substance having a light-emitting property is dispersed in another substance is employed, crystallization of the light-emitting layer 1013 can be suppressed. In addition, concentration quenching which results from high concentration of the substance having a light-emitting property can be suppressed.

The electron-transport layer 1014 is a layer including a substance having a high electron-transport property. As the substance having a high electron-transport property, for example, a layer containing a metal complex having a quinoline skeleton or a benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum (abbreviation: BAlq) can be used. In addition, a metal complex or the like including an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc(II) (abbreviation: Zn(BTZ)$_2$) can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazole-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), bis[3-(1H-benzimidazol-2-yl)fluoren-2-olato]zinc(II), bis[3-(1H-benzimidazol-2-yl)fluoren-2-olato]beryllium(II), bis[2-(1H-benzimidazol-2-yl)dibenzo[b,d]furan-3-olato](phenolato)aluminum(III), bis[2-(benzoxazol-2-yl)-7,8-methylenedioxydibenzo[b,d]furan-3-olato](2-naphtholato)aluminum(III), or the like can also be used. The substances mentioned here are mainly ones that have an electron mobility higher than or equal to $10^{-6}$ cm$^2$/Vs. Note that the electron-transport layer 1014 may be formed of substances other than those described above as long as their electron-transport properties are higher than their hole-transport properties. The electron-transport layer 1014 is not limited to a single layer and may be a stacked layer which includes two or more layers each containing the aforementioned substance.

The electron-injection layer 1015 is a layer including a substance having a high electron-injection property. As the material having a high electron-injection property, the following can be given: an alkali metal or an alkaline earth metal such as lithium fluoride (LiF), cesium fluoride (CsF), and calcium fluoride (CaF$_2$), and a compound thereof. It is also possible to use an electron-injection composite material including an organic compound (preferably, an organic compound having an electron-transport property) and an inorganic compound (preferably, an alkali metal, an alkaline earth metal, a rare earth metal, or a compound of these metals). As the electron-injection composite material, for example, a layer made of Alq mixed with magnesium (Mg) may be used. Such a structure increases the efficiency in electron injection from the cathode 1002.

Note that in the case where the electron-injection layer 1015 is made of the aforementioned electron-injection composite material, a variety of conductive materials such as Al, Ag, ITO, or ITO containing silicon or silicon oxide can be used for the cathode 1002 regardless of the work function.

Such layers are stacked in appropriate combination, whereby the EL layer 1003 can be formed. The light-emitting layer 1013 may have a stacked-layer structure including two or more layers. The light-emitting layer 1013 has a stacked-layer structure including two or more layers and a different light-emitting substance is used for each light-emitting layer, so that a variety of emission colors can be obtained. In addition, a plurality of light-emitting substances of different colors is used as the light-emitting substance, whereby light emission having a broad spectrum or white light emission can also be obtained. In particular, for a backlight for which high luminance is required, a structure in which light-emitting layers are stacked is preferable.

Further, as a formation method of the EL layer 1003, a variety of methods (e.g., a dry process and a wet process) can be selected as appropriate depending on a material to be used. For example, a vacuum evaporation method, a sputtering method, an ink-jet method, a spin coating method, or the like can be used. Note that a different formation method may be employed for each layer.

The EL element 1025 described in this embodiment can be formed by any of a variety of methods regardless of whether it is a dry process (e.g., a vacuum evaporation method or a sputtering method) or a wet process (e.g., an ink-jet method or a spin coating method).

Note that the structure of the EL element 1025 described in this embodiment may be a structure in which a plurality of EL layers 1003 are stacked between a pair of electrodes as illustrated in FIG. 5C, that is, a stacked-layer element structure. Note that in the case of a structure in which n (n is a natural number of 2 or more) EL layers 1003 are stacked, an intermediate layer 1004 is provided between an m-th (m is a natural number greater than or equal to 1 and less than or equal to n−1) EL layer and an (m+1)-th EL layer.

The intermediate layer 1004 has a function of injecting electrons to one of the EL layers 1003 on the anode 1001 side formed in contact with the intermediate layer 1004, and injecting holes to the other EL layer 1003 on the cathode 1002 side, when a voltage is applied to the anode 1001 and the cathode 1002.

The intermediate layer 1004 can be made not only by using the aforementioned composite materials (the hole-injection composite material or the electron-injection composite material) of an organic compound and an inorganic compound, but also by appropriately combining materials such as metal oxides. More preferably, the intermediate layer 1004 is made of a combination of the hole-injection composite material and other materials. Such materials used for the intermediate layer 1004 have an excellent carrier-injection property and carrier-transport property, whereby the EL element 1025 driven with low current and low voltage can be realized.

In a structure of the stacked-layer element, in the case where the EL layer has a two-layer stacked structure, white color light can be extracted outside by allowing a first EL layer and a second EL layer to emit light of complementary colors. White light emission can also be obtained with a structure in which the first EL layer and the second EL layer each include a plurality of light-emitting layers emitting light of complementary colors. As a complementary relation, blue and yellow, blue green and red, and the like can be given. A substance which emits light of blue, yellow, blue-green, or red light may be selected as appropriate from, for example, the light-emitting substances given above.

The following is an example of a structure where each of the first EL layer and the second EL layer includes a plurality of light-emitting layers emitting light of complementary colors. With this structure, white light emission can be obtained.

For example, the first EL layer includes a first light-emitting layer exhibiting light emission with a spectrum whose peak is in the wavelength range of blue to blue-green, and a second light-emitting layer exhibiting light emission with a spectrum whose peak is in the wavelength range of yellow to orange. The second EL layer includes a third light-emitting layer exhibiting light emission with a spectrum whose peak is in the wavelength range of blue-green to green, and a fourth light-emitting layer exhibiting light emission with a spectrum whose peak is in the wavelength range of orange to red.

In this case, light emission from the first EL layer is a combination of light emission from both the first light-emitting layer and the second light-emitting layer and thus exhibits a light emission spectrum having peaks both in the wavelength range of blue to blue-green and in the wavelength range of yellow to orange. That is, the first EL layer exhibits light emission having a 2-wavelength-type white color or a 2-wavelength-type color that is similar to white.

In addition, light emission from the second EL layer is a combination of light emission from both the third light-emitting layer and the fourth light-emitting layer and thus exhibits a light emission spectrum having peaks both in the wavelength range of blue-green to green and in the wavelength range of orange to red. That is, the second EL layer exhibits light emission having a 2-wavelength-type white color or a 2-wavelength-type color that is similar to white, which is different from the first EL layer.

Consequently, by combining the light-emission from the first EL layer and the light emission from the second EL layer, white light emission which covers the wavelength range of blue to blue-green, the wavelength range of blue-green to green, the wavelength range of yellow to orange, and the wavelength range of orange to red can be obtained.

Note that in the structure of the above-mentioned stacked layer element, by provision of intermediate layers between the stacked EL layers, the element can have long lifetime in a high-luminance region while the current density is kept low. In addition, the voltage drop due to resistance of the electrode material can be reduced, whereby uniform light emission in a large area is possible.

Note that the backlight portion described in FIGS. 4A to 4C and FIGS. 5A to 5C may have a structure in which luminance is adjusted. For example, a structure in which luminance is adjusted in accordance with illuminance around the liquid crystal display device or a structure in which luminance is adjusted in accordance with a displayed image signal may be employed.

Note that color display is enabled by combination of color filters. Alternatively, other optical films (such as a polarizing film, a retardation film, and an anti-reflection film) can also be used in combination. Note that the color filter is not provided in the case where light-emitting diodes of RGB or the like are arranged in a backlight and a successive additive color mixing method (a field sequential method) in which color display is performed by time division is employed.

Note that this embodiment can be freely combined with the other embodiments.

Embodiment 4

In this embodiment, an example of a transistor that can be applied to a liquid crystal display device disclosed in this specification will be described. There is no particular limitation on a structure of the transistor that can be applied to the liquid crystal display device disclosed in this specification. For example, a staggered transistor, a planar transistor, or the like having a top-gate structure in which a gate electrode is placed on an upper side of an oxide semiconductor layer with a gate insulating layer interposed or a bottom-gate structure in which a gate electrode is placed on a lower side of an oxide semiconductor layer with a gate insulating layer interposed, can be used. The transistor may have a single gate structure including one channel formation region, a double gate structure including two channel formation regions, or a triple gate structure including three channel formation regions. Alternatively, the transistor may have a dual gate structure including two gate electrode layers placed over and below a channel region with a gate insulating layer interposed. FIGS. 6A to 6D illustrate examples of cross-sectional structures of transistors. Each of the transistors illustrated in FIGS. 6A to 6D uses an oxide semiconductor as a semiconductor. An advantage of using an oxide semiconductor is that field-effect mobility (the maximum value is greater than or equal to 5 $cm^2/Vsec$, preferably in the range of 10 $cm^2/Vsec$ to 150 $cm^2/Vsec$) can be obtained when a transistor is on, and low off current (less than 1 aA/μm, preferably less than 10 zA/μm at room temperature and less than 100 zA/μm at 85° C.) can be obtained when the transistor is off.

Figure 6A:
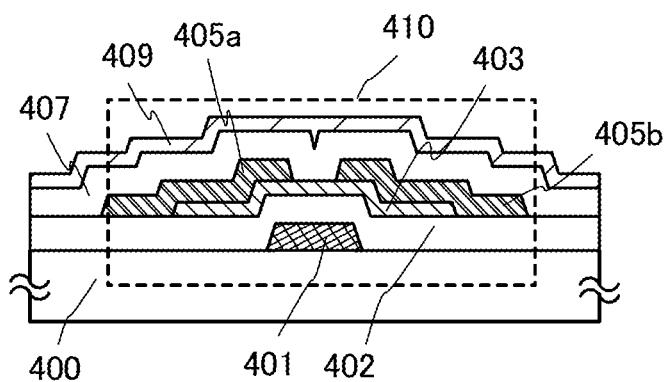
FIGS. 6A to 6D are diagrams each illustrating an example of a transistor which can be applied to a liquid crystal display device.

A transistor 410 illustrated in FIG. 6A is one of bottom-gate transistors and is also referred to as an inverted staggered transistor.

The transistor 410 includes, over a substrate 400 having an insulating surface, a gate electrode layer 401, a gate insulating layer 402, an oxide semiconductor layer 403, a source electrode layer 405*a*, and a drain electrode layer 405*b*. An insulating film 407 is provided to cover the transistor 410 and be stacked over the oxide semiconductor layer 403. Further, a protective insulating layer 409 is formed over the insulating film 407.

Figure 6B:
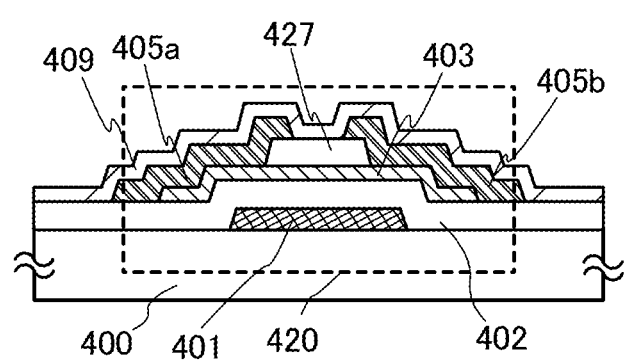

A transistor 420 illustrated in FIG. 6B is one of bottom-gate transistors referred to as a channel-protective type (also referred to as a channel-stop type) and is also referred to as an inverted staggered transistor.

The transistor 420 includes, over the substrate 400 having an insulating surface, the gate electrode layer 401, the gate insulating layer 402, the oxide semiconductor layer 403, an insulating film 427 functioning as a channel protective layer covering a channel formation region of the oxide semiconductor layer 403, the source electrode layer 405*a*, and the drain electrode layer 405*b*. Further, the protective insulating layer 409 is formed to cover the transistor 420.

Figure 6C:
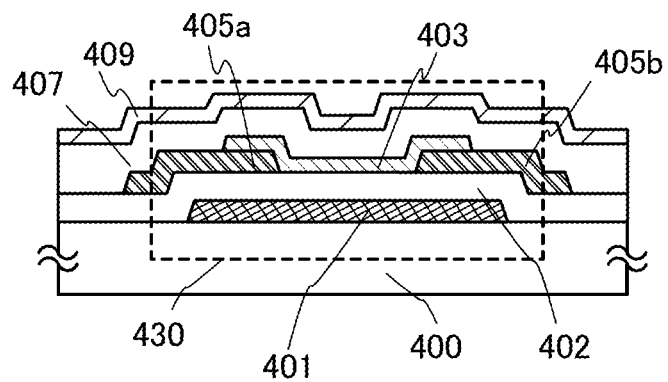

A transistor 430 illustrated in FIG. 6C is a bottom-gate transistor and includes, over the substrate 400 having an insulating surface, the gate electrode layer 401, the gate insulating layer 402, the source electrode layer 405a, the drain electrode layer 405b, and the oxide semiconductor layer 403. The insulating film 407 is provided to cover the transistor 430 and to be in contact with the oxide semiconductor layer 403. Further, the protective insulating layer 409 is formed over the insulating film 407.

In the transistor 430, the gate insulating layer 402 is provided over and in contact with the substrate 400 and the gate electrode layer 401; the source electrode layer 405a and the drain electrode layer 405b are provided over and in contact with the gate insulating layer 402. The oxide semiconductor layer 403 is provided over the gate insulating layer 402, the source electrode layer 405a, and the drain electrode layer 405b.

Figure 6D:
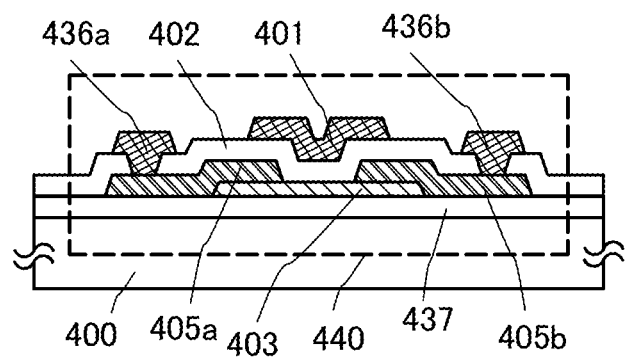

A transistor 440 illustrated in FIG. 6D is one of top-gate transistors. The transistor 440 includes, over the substrate 400 having an insulating surface, an insulating layer 437, the oxide semiconductor layer 403, the source electrode layer 405a, the drain electrode layer 405b, the gate insulating layer 402, and the gate electrode layer 401. A wiring layer 436a and a wiring layer 436b are provided in contact with and electrically connected to the source electrode layer 405a and the drain electrode layer 405b respectively.

In this embodiment, the oxide semiconductor layer 403 is used as a semiconductor layer as described above. As an oxide semiconductor used for the oxide semiconductor layer 403, the following metal oxides can be used: a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor; an In—O-based oxide semiconductor; a Sn—O-based oxide semiconductor; and a Zn—O-based oxide semiconductor. In addition, $SiO_2$ may be contained in the above oxide semiconductor. Here, for example, an In—Ga—Zn—O-based oxide semiconductor means an oxide film containing indium (In), gallium (Ga), and zinc (Zn), and there is no particular limitation on the stoichiometric proportion thereof. The In—Ga—Zn—O-based oxide semiconductor may contain an element other than In, Ga, and Zn.

As the oxide semiconductor layer 403, a thin film expressed by a chemical formula of $InMO_3(ZnO)_m$ (m>0, where m is not an integer) can be used. Here, M represents one or more metal elements selected from Ga, Al, Mn, and Co. For example, M can be Ga, Ga and Al, Ga and Mn, Ga and Co, or the like.

In each of the transistors 410, 420, 430, and 440 using the oxide semiconductor layer 403, the current value in an off state (off current value) can be reduced. Thus, the holding period of an electric signal of an image signal or the like can be extended and an interval between writing operations can be set longer in the state where power supply is on. Consequently, the frequency of refresh operation can be decreased, whereby power consumption can be effectively suppressed.

In addition, each of the transistors 410, 420, 430, and 440 using the oxide semiconductor layer 403 can operate at high speed because relatively high field-effect mobility can be obtained. Consequently, when the above transistors are used in a pixel portion of a liquid crystal display device, color separation can be suppressed and high-quality images can be obtained. In addition, since the transistors can be separately provided in a driver circuit portion and a pixel portion over one substrate, the number of components of the liquid crystal display device can be reduced.

There is no limitation on a substrate that can be applied to the substrate 400 having an insulating surface. For example, a glass substrate such as a glass substrate made of barium borosilicate glass or aluminosilicate glass can be used.

In the bottom-gate transistors 410, 420, and 430, an insulating film serving as a base film may be provided between the substrate and the gate electrode layer. The base film has a function of preventing diffusion of an impurity element from the substrate, and can be formed to have a stacked-layer structure using one or more of a silicon nitride film, a silicon oxide film, a silicon nitride oxide film, and a silicon oxynitride film.

The gate electrode layer 401 can be formed to have a single-layer structure or a stacked-layer structure using a metal material such as molybdenum, titanium, chromium, tantalum, tungsten, aluminum, copper, neodymium, or scandium, or an alloy material which contains any of these materials as its main component.

The gate insulating layer 402 can be formed with a single-layer structure or a layered structure using any of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and a hafnium oxide layer by a plasma CVD method, a sputtering method, or the like. For example, a silicon nitride layer ($SiN_y$ (y>0)) having a thickness of 50 nm to 200 nm inclusive is formed as a first gate insulating layer with a plasma CVD method, and a silicon oxide layer ($SiO_x$ (x>0)) having a thickness of 5 nm to 300 nm inclusive is formed as a second gate insulating layer over the first gate insulating layer, so that a gate insulating layer with a total thickness of 200 nm is formed.

As a conductive film used for the source electrode layer 405a and the drain electrode layer 405b, for example, a metal film containing an element selected from Al, Cr, Cu, Ta, Ti, Mo, and W and a metal nitride film containing any of the above elements as its main component (a titanium nitride film, a molybdenum nitride film, and a tungsten nitride film) can be used. A metal film having a high melting point such as Ti, Mo, W, or the like or a metal nitride film of any of these elements (a titanium nitride film, a molybdenum nitride film, and a tungsten nitride film) may be stacked on one of or both of a lower side or an upper side of a metal film of Al, Cu, or the like.

The same material as that of the source electrode layer 405a and the drain electrode layer 405b can be also used for a conductive film used for the wiring layer 436a and the wiring layer 436b which are connected to the source electrode layer 405a and the drain electrode layer 405b respectively.

The conductive film to be the source electrode layer 405a and the drain electrode layer 405b (including a wiring layer formed using the same layer as the source electrode layer 405a and the drain electrode layer 405b) may be formed using conductive metal oxide. As the conductive metal oxide, indium oxide ($In_2O_3$), tin oxide ($SnO_2$), zinc oxide (ZnO), an alloy of indium oxide and tin oxide ($In_2O_3$—$SnO_2$, referred to as ITO), an alloy of indium oxide and zinc oxide ($In_2O_3$—ZnO), and such a metal oxide material containing silicon oxide can be used.

As the insulating films 407, 427, and 437, an inorganic insulating film such as a silicon oxide film, a silicon oxynitride film, an aluminum oxide film, or an aluminum oxynitride film can be typically used.

For the protective insulating layer 409 provided over the oxide semiconductor layer, an inorganic insulating film such as a silicon nitride film, an aluminum nitride film, a silicon nitride oxide film, or an aluminum nitride oxide film can be used.

Further, a planarization insulating film may be formed over the protective insulating layer 409 so that surface roughness due to the transistor is reduced. As the planarization insulating film, an organic material such as polyimide, an acrylic resin, and a benzocyclobutene-based resin can be used. Besides the above organic materials, a low-dielectric constant material (a low-k material) or the like can be used. Note that the planarization insulating film may be formed by stacking a plurality of insulating films formed of any of these materials.

Figure 13:
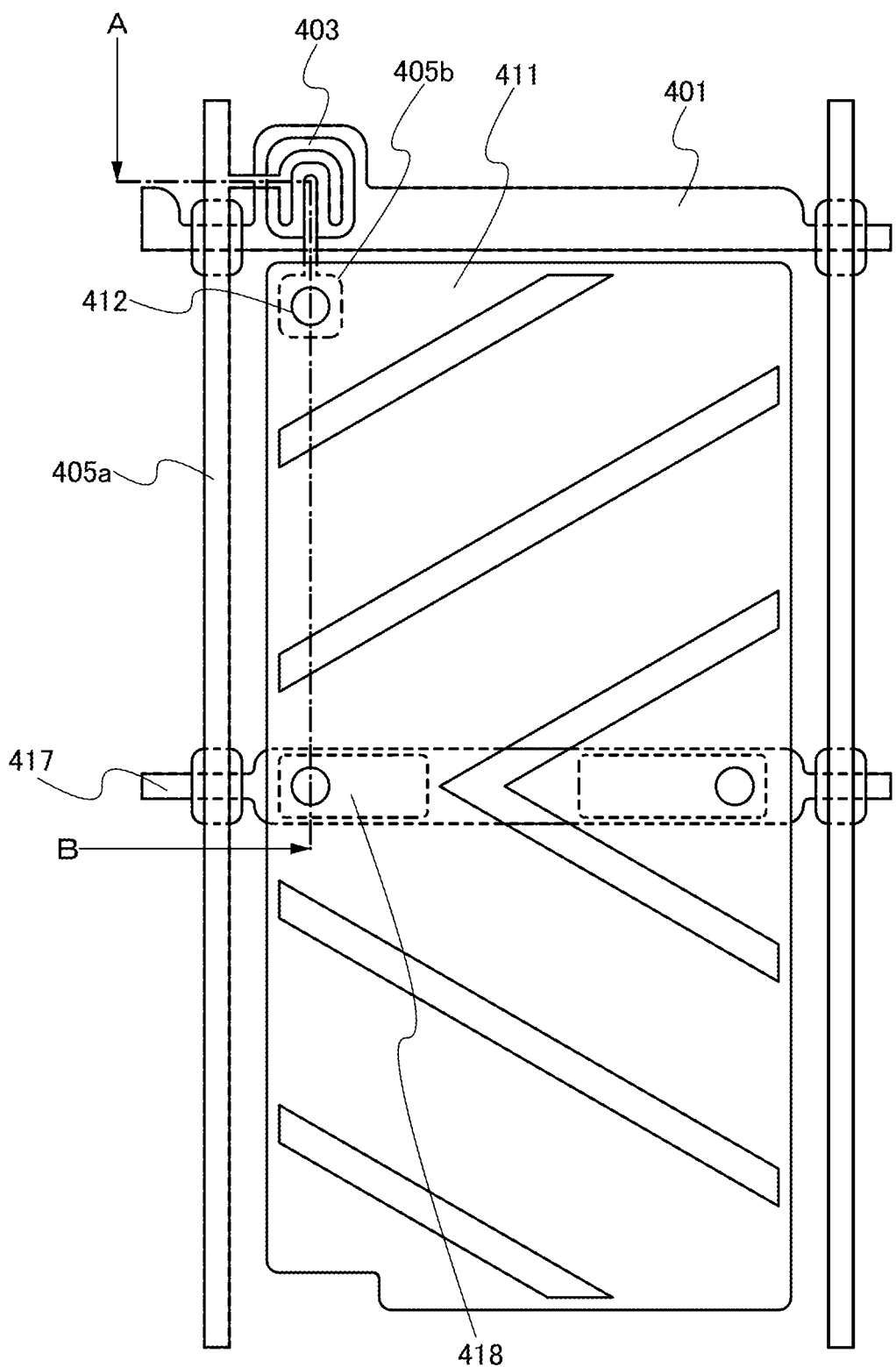
FIG. 13 is a plan view illustrating an example of a pixel of a liquid crystal display device.
Figure 14:
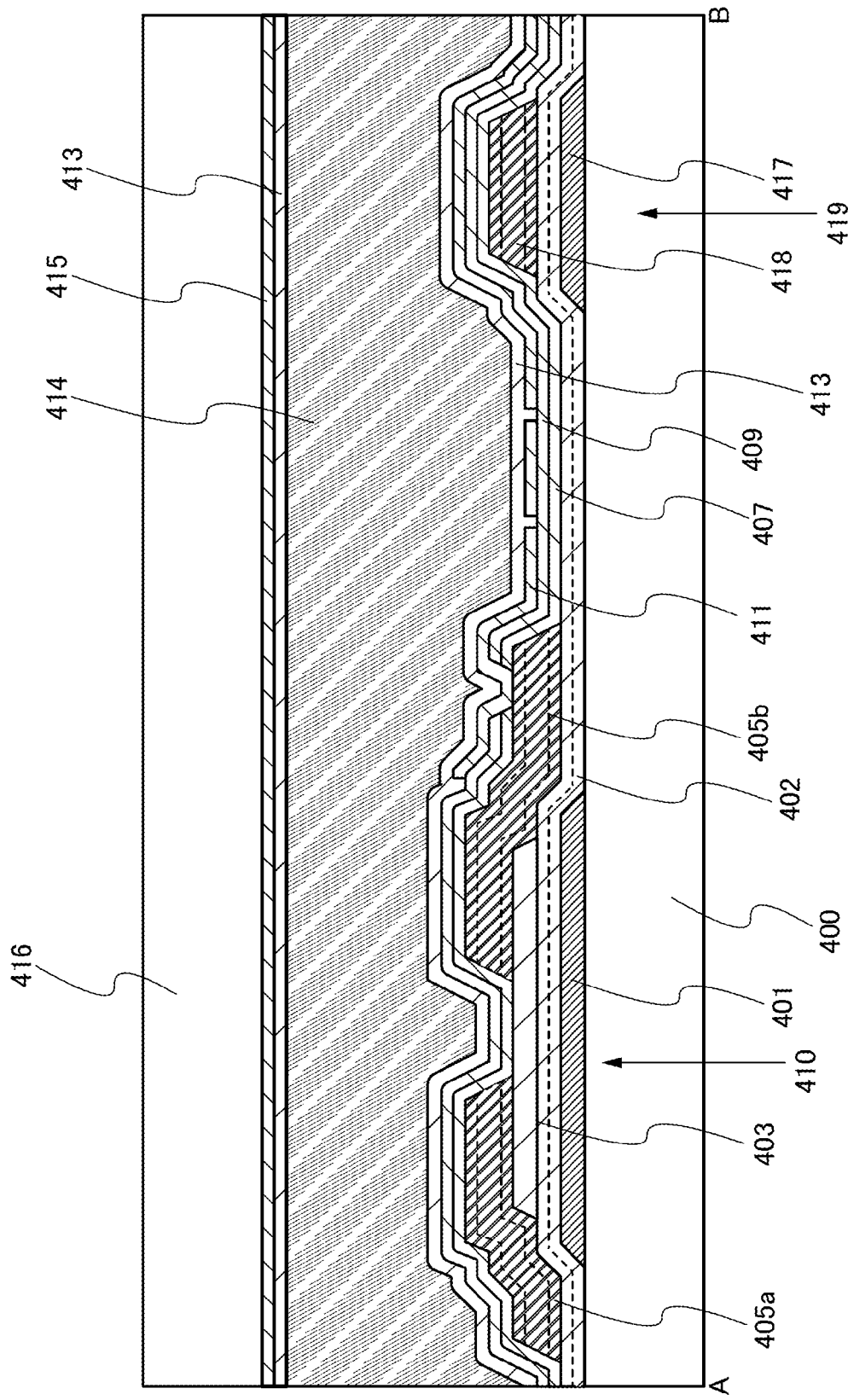
FIG. 14 is a cross-sectional view illustrating an example of a pixel of a liquid crystal display device.

An example of a pixel in a liquid crystal display device using such a transistor is illustrated in FIG. 13 and FIG. 14. FIG. 13 illustrates a plan view of the pixel and FIG. 14 illustrates a cross-sectional view taken along a line A-B shown in FIG. 13. Note that FIG. 13 illustrates a plan view of the substrate 400 over which a transistor 410 is formed, and FIG. 14 illustrates a structure in which a counter substrate 416 and a liquid crystal layer 414 are formed in addition to a structure of the substrate 400 over which a transistor 410 is formed. The following description will be given with reference to both FIG. 13 and FIG. 14.

A structure of the transistor 410 is the same as that in FIG. 6A, and includes the gate electrode layer 401, the gate insulating layer 402, and the oxide semiconductor layer 403. When a pixel is provided, the gate electrode layer 401 is formed to extend in one direction. The oxide semiconductor layer 403 is provided to overlap with the gate electrode layer 401 with the gate insulating layer 402 interposed therebetween. The source electrode layer 405a and the drain electrode layer 405b are provided on an upper side of the oxide semiconductor layer 403 (note that here, the terms the source electrode layer 405a" and the drain electrode layer 405b" are used for convenience to distinguish electrodes in the transistor 410). The source electrode layer 405a is extended in direction to get across the gate electrode layer 401. A pixel electrode 411 is provided over the protective insulating layer 409, and the pixel electrode 411 is connected to the drain electrode layer 405b through a contact hole 412. The pixel electrode 411 is formed from a transparent electrode material such as indium tin oxide, zinc oxide, or tin oxide.

A storage capacitor 419 may be provided as appropriate. When the storage capacitor 419 is provided, the storage capacitor 419 is formed including a capacitor wiring layer 417 formed in the same layer as the gate electrode layer 401, and a capacitor electrode layer 418. Between the capacitor wiring layer 417 and the capacitor electrode layer 418, the gate insulating layer 402 is extended to function as a dielectric, so that the storage capacitor 419 is formed.

Slits are provided in the pixel electrode 411, whereby alignment of liquid crystal can be controlled. Such a structure is applied to a vertical alignment (VA) mode. The VA mode is a mode of controlling alignment of liquid crystal molecules of a liquid crystal panel. The VA mode is a mode in which liquid crystal molecules are aligned vertically to a panel surface when voltage is not applied. Note that other than the VA mode, a twisted nematic (TN) mode, a multi-domain vertical alignment (MVA) mode, an in-plane vertical switching (IPS) mode, a continuous pinwheel alignment (CPA) mode, a patterned vertical alignment (PVA) mode, or the like can be applied.

A counter electrode 415 is provided on the counter substrate 416 side. The liquid crystal layer 414 is provided between the substrate 400 and the counter substrate 416. An alignment film 413 is provided to be in contact with the liquid crystal layer 414. Alignment treatment for the alignment film 413 is performed by an optical alignment method or a rubbing method. As a liquid crystal phase of the liquid crystal layer 414, a nematic phase, a smectic phase, a cholesteric phase, a blue phase, or the like can be used.

One unit is formed including the following components: the transistor 410 in which the oxide semiconductor layer 403 is provided to overlap with the gate electrode layer 401 with the gate insulating layer 402 interposed; the pixel electrode 411 which is connected to the source side or the drain side of the transistor 410 and drives liquid crystal; the counter electrode 415 provided to face the pixel electrode 411; and the liquid crystal layer 414 provided between the pixel electrode 411 and the counter electrode 415. A pixel can be constituted by one or more of these units, and a display panel which displays an image or the like can be formed by arranging the pixels in matrix.

In such a manner, by using a transistor including an oxide semiconductor layer having high field-effect mobility and low off current in this embodiment, a liquid crystal display device with low power consumption can be provided.

Embodiment 5

In this embodiment, examples of a transistor including an oxide semiconductor layer and a manufacturing method thereof will be described in detail below with reference to FIGS. 7A to 7E. The same portion as or a portion having a function similar to those in the above embodiment can be formed in a manner similar to that described in the above embodiment, and repetitive description is omitted. In addition, detailed description of the same portions is not repeated.

Figure 7A:
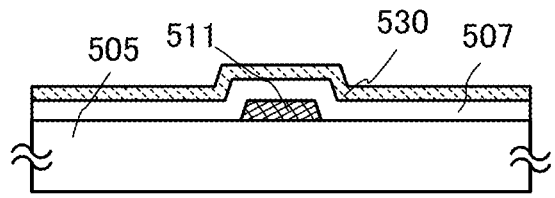
FIGS. 7A to 7E are diagrams illustrating an example of a transistor including an oxide semiconductor layer and an example of a manufacturing method thereof.
Figure 7B:
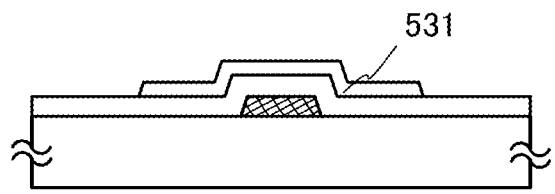
Figure 7C:
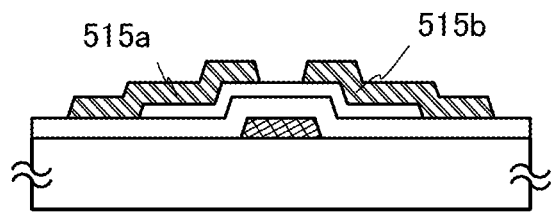
Figure 7D:
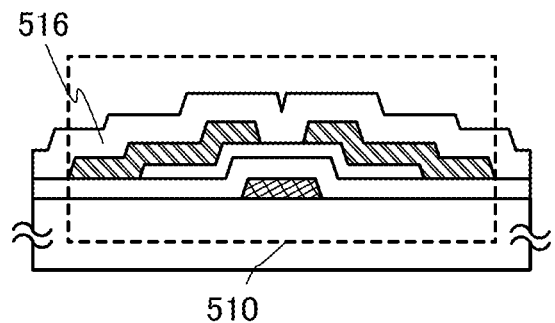
Figure 7E:
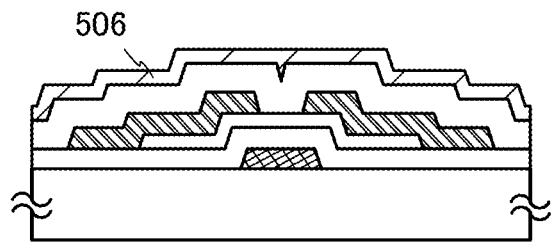

FIGS. 7A to 7E illustrate an example of a cross-sectional structure of a transistor. A transistor 510 illustrated in FIGS. 7D and 7E is an inverted staggered thin film transistor having a bottom gate structure, which is similar to the transistor 410 illustrated in FIG. 6A.

Hereinafter, a manufacturing process of the transistor 510 over a substrate 505 is described with reference to FIGS. 7A to 7E.

First, a conductive film is formed over the substrate 505 having an insulating surface, and then, a gate electrode layer 511 is formed through a first photolithography step. Note that a resist mask may be formed by an inkjet method. Formation of the resist mask by an inkjet method needs no photomask; thus, manufacturing cost can be reduced.

As the substrate 505 having an insulating surface, a substrate similar to the substrate 400 described in Embodiment 4 can be used. In this embodiment, a glass substrate is used as the substrate 505.

An insulating film serving as a base film may be provided between the substrate 505 and the gate electrode layer 511. The base film has a function of preventing diffusion of an impurity element from the substrate 505, and can be formed with a single-layer structure or a stacked-layer structure using one or more of a silicon nitride film, a silicon oxide film, a silicon nitride oxide film, and a silicon oxynitride film.

The gate electrode layer 511 can be formed to have a single-layer structure or a stacked-layer structure using any of a metal material such as molybdenum, titanium, tantalum, tungsten, aluminum, copper, neodymium, or scandium, and an alloy material which includes any of these metal materials as a main component.

Next, a gate insulating layer 507 is formed over the gate electrode layer 511. The gate insulating layer 507 can be formed by a plasma CVD method, a sputtering method, or the like to have a single layer structure or a stacked-layer structure using any of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and a hafnium oxide layer.

For the oxide semiconductor in this embodiment, an oxide semiconductor which is made to be an i-type semiconductor or a substantially i-type semiconductor by removing an impurity is used. Such a highly purified oxide semiconductor is highly sensitive to an interface state and interface charges; thus, an interface between the oxide semiconductor layer and the gate insulating layer is important. For that reason, the gate insulating layer that is to be in contact with a highly purified oxide semiconductor needs to have high quality.

For example, high-density plasma CVD using microwaves (e.g., with a frequency of 2.45 GHz) is preferably adopted because an insulating layer can be dense and have high withstand voltage and high quality. The highly purified oxide semiconductor and the high-quality gate insulating layer are in contact with each other, whereby the interface state density can be reduced to obtain favorable interface characteristics.

Needless to say, another film formation method such as a sputtering method or a plasma CVD method can be employed as long as the method enables formation of a high-quality insulating layer as a gate insulating layer. Further, an insulating layer whose film quality and characteristics of the interface between the insulating layer and an oxide semiconductor are improved by heat treatment which is performed after formation of the insulating layer may be formed as a gate insulating layer. In any case, any insulating layer may be used as long as the insulating layer has characteristics of enabling a reduction in interface state density of the interface between the insulating layer and an oxide semiconductor and formation of a favorable interface as well as that having favorable film quality as a gate insulating layer.

In order to contain hydrogen, a hydroxyl group, and moisture in the gate insulating layer 507 and an oxide semiconductor film 530 as little as possible, it is preferable to perform pretreatment before the formation of the oxide semiconductor film 530. As the pretreatment, the substrate 505 provided with the gate electrode layer 511 or a substrate 505 over which the gate electrode layer 511 and the gate insulating layer 507 are formed is preheated in a preheating chamber of a sputtering apparatus, whereby an impurity such as hydrogen or moisture adsorbed on the substrate 505 is removed and then, evacuation is performed. As an evacuation unit provided in the preheating chamber, a cryopump is preferable. Note that this preheating treatment can be omitted. Further, heat treatment like the above preheating may be performed in a similar manner on the substrate 505 in a state where a source electrode layer 515a and a drain electrode layer 515b have been formed thereover but an insulating layer 516 has not been formed yet.

Next, over the gate insulating layer 507, the oxide semiconductor film 530 having a thickness greater than or equal to 2 nm and less than or equal to 200 nm, preferably greater than or equal to 5 nm and less than or equal to 30 nm is formed (see FIG. 7A).

Note that before the oxide semiconductor film 530 is formed by a sputtering method, powder substances (also referred to as particles or dust) which attach on a surface of the gate insulating layer 507 are preferably removed by reverse sputtering in which an argon gas is introduced and plasma is generated. The reverse sputtering refers to a method in which, without applying a voltage to a target side, an RF power source is used for application of a voltage to a substrate in an argon atmosphere to generate plasma in the vicinity of the substrate side to modify a surface. Note that instead of an argon atmosphere, a nitrogen atmosphere, a helium atmosphere, an oxygen atmosphere, or the like may be used.

As an oxide semiconductor for the oxide semiconductor film 530, the oxide semiconductor described in Embodiment 4 can be used. Further, $SiO_2$ may be contained in the above oxide semiconductor. In this embodiment, the oxide semiconductor film 530 is deposited by a sputtering method with the use of an In—Ga—Zn—O-based oxide target. A cross-sectional view at this stage is illustrated in FIG. 7A. Alternatively, the oxide semiconductor film 530 can be formed by a sputtering method in a rare gas (typically argon) atmosphere, an oxygen atmosphere, or a mixed atmosphere containing a rare gas and oxygen.

The target used for the formation of the oxide semiconductor film 530 by a sputtering method is, for example, a metal oxide target containing $In_2O_3$, $Ga_2O_3$, and ZnO at a composition ratio of 1:1:1 [molar ratio], so that an In—Ga—Zn—O film is formed. Without limitation to the material and the component of the target, for example, a metal oxide target containing $In_2O_3$, $Ga_2O_3$, and ZnO at 1:1:2 [molar ratio] may be used.

The filling factor of the metal oxide target is greater than or equal to 90% and less than or equal to 100%, preferably greater than or equal to 95% and less than or equal to 99.9%. With use of the metal oxide target with high filling factor, a dense oxide semiconductor film can be formed.

It is preferable that a high-purity gas from which an impurity such as hydrogen, water, a compound including a hydroxyl group, or a hydride is removed be used as a sputtering gas used for forming the oxide semiconductor film 530.

The substrate is held in a deposition chamber kept under reduced pressure, and the substrate temperature is set to 100° C. to 600° C. inclusive, preferably 200° C. to 400° C. inclusive. Formation of the oxide semiconductor film is conducted with heating the substrate, whereby the concentration of impurities included in the formed oxide semiconductor film can be reduced. In addition, damage by sputtering can be reduced. Then, a sputtering gas from which hydrogen and moisture are removed is introduced into the deposition chamber where remaining moisture is being removed, and the oxide semiconductor film 530 is deposited with use of the above target, over the substrate 505. In order to remove remaining moisture from the deposition chamber, an adsorption-type vacuum pump such as a cryopump, an ion pump, or a titanium sublimation pump is preferably used. The evacuation unit may be a turbo pump provided with a cold trap. In the deposition chamber which is evacuated with use of the cryopump, a hydrogen atom, a compound including a hydrogen atom, such as water ($H_2O$) (more preferably, also a compound including a carbon atom), and the like are removed, whereby the concentration of impurities in the oxide semiconductor film formed in the deposition chamber can be reduced.

As one example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that use of a pulse direct current power source is preferable because powder substances (also referred to as particles or dust) generated in film formation can be reduced and the film thickness can be uniform.

Then, through a second photolithography step, the oxide semiconductor film 530 is processed into an island-shaped oxide semiconductor layer. A resist mask for forming the island-shaped oxide semiconductor layer may be formed by an ink-jet method. Formation of the resist mask by an inkjet method needs no photomask; thus, manufacturing cost can be reduced.

In the case where a contact hole is formed in the gate insulating layer 507, a step of forming the contact hole can be performed at the same time as processing of the oxide semiconductor film 530.

Note that the etching of the oxide semiconductor film 530 may be dry etching, wet etching, or both dry etching and wet etching. As an etchant used for wet etching of the oxide semiconductor film 530, for example, a mixed solution of phosphoric acid, acetic acid, and nitric acid, such as ITO07N (produced by KANTO CHEMICAL CO., INC.) can be used.

Next, the oxide semiconductor layer is subjected to first heat treatment. By this first heat treatment, the oxide semiconductor layer can be dehydrated or dehydrogenated. The temperature of the first heat treatment is higher than or equal to 400° C. and lower than or equal to 750° C., preferably higher than or equal to 400° C. and lower than the strain point of the substrate. Here, the substrate is introduced into an electric furnace which is one of heat treatment apparatuses, heat treatment is performed on the oxide semiconductor layer in a nitrogen atmosphere at 450° C. for one hour, and then, the oxide semiconductor layer is not exposed to the air so that entry of water and hydrogen into the oxide semiconductor layer is prevented; thus, an oxide semiconductor layer 531 is obtained (see FIG. 7B).

A heat treatment apparatus used in this step is not limited to an electric furnace, and a device for heating an object to be processed by heat conduction or heat radiation from a heating element such as a resistance heating element may be alternatively used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high temperature gas, an inert gas which does not react with an object to be processed by heat treatment, such as nitrogen or a rare gas like argon, is used.

For example, as the first heat treatment, GRTA may be performed as follows: the substrate is transferred and put into an inert gas heated to a high temperature as high as 650° C. to 700° C., heated for several minutes, and taken out from the inert gas heated to the high temperature.

Note that in the first heat treatment, it is preferable that water, hydrogen, and the like be not contained in the atmosphere of nitrogen or a rare gas such as helium, neon, or argon. The purity of nitrogen or the rare gas such as helium, neon, or argon which is introduced into the heat treatment apparatus is preferably set to be higher than or equal to 6N (99.9999%), far preferably higher than or equal to 7N (99.99999%) (that is, the impurity concentration is preferably lower than or equal to 1 ppm, far preferably lower than or equal to 0.1 ppm).

After the oxide semiconductor layer is heated by the first heat treatment, a high-purity oxygen gas, a high-purity $N_2O$ gas, or ultra-dry air (having a dew point of lower than or equal to −40° C., preferably lower than or equal to −60° C.) may be introduced into the same furnace. It is preferable that water, hydrogen, or the like be not contained in the oxygen gas or the $N_2O$ gas. Alternatively, the purity of an oxygen gas or an $N_2O$ gas which is introduced into the heat treatment apparatus is preferably higher than or equal to 6N, further preferably higher than or equal to 7N (i.e., the impurity concentration of the oxygen gas or the $N_2O$ gas is lower than or equal to 1 ppm, preferably lower than or equal to 0.1 ppm). Although oxygen which is a main component included in the oxide semiconductor is reduced through the elimination of impurities by performance of dehydration treatment or dehydrogenation treatment, oxygen is supplied by the effect of introduction of the oxygen gas or the $N_2O$ gas in the above manner, so that the oxide semiconductor layer is highly purified and made to be an electrically i-type (intrinsic) semiconductor.

Alternatively, the first heat treatment of the oxide semiconductor layer can be performed on the oxide semiconductor film 530 which has not yet been processed into the island-shaped oxide semiconductor layer. In that case, the substrate is taken out from the heat apparatus after the first heat treatment, and then a photolithography step is performed.

Note that other than the above timing, the first heat treatment may be performed at any of the following timings as long as it is after the oxide semiconductor layer is formed. For example, the timing may be after a source electrode layer and a drain electrode layer are formed over the oxide semiconductor layer or after an insulating layer is formed over the source electrode layer and the drain electrode layer.

In the case where a contact hole is formed in the gate insulating layer 507, the formation of the contact hole may be performed before or after the first heat treatment is performed on the oxide semiconductor film 530.

Alternatively, an oxide semiconductor layer may be formed through two film formation steps and two heat treatment steps. The thus formed oxide semiconductor layer has a thick crystalline region (non-single-crystal region), that is, a crystalline region the c-axis of which is aligned in a direction perpendicular to a surface of the layer, even when a base component includes any of an oxide, a nitride, a metal, or the like. For example, a first oxide semiconductor film with a thickness greater than or equal to 3 nm and less than or equal to 15 nm is deposited, and first heat treatment is performed in a nitrogen, oxygen, rare gas, or dry air atmosphere at 450° C. to 850° C. inclusive, preferably 550° C. to 750° C. inclusive, so that the first oxide semiconductor film has a crystalline region (including a plate-like crystal) on a surface thereof. Then, a second oxide semiconductor film which has a larger thickness than the first oxide semiconductor film is formed, and second heat treatment is performed at 450° C. to 850° C. inclusive, preferably 600° C. to 700° C. inclusive, so that crystal growth proceeds upward with use of the first oxide semiconductor film as a seed of the crystal growth and the whole second oxide semiconductor film is crystallized. In such a manner, the oxide semiconductor layer having a thick crystalline region may be obtained.

Next, a conductive film to be the source and drain electrode layers (including a wiring formed in the same layer as the source and drain electrode layers) is formed over the gate insulating layer 507 and the oxide semiconductor layer 531. The conductive film to be the source and drain electrode layers can be formed using the material which is used for the source electrode layer 405a and the drain electrode layer 405b described in Embodiment 4.

By performance of a third photolithography step, a resist mask is formed over the conductive film, and selective etching is performed, so that the source electrode layer 515a and the drain electrode layer 515b are formed. Then, the resist mask is removed (see FIG. 7C).

Light exposure at the time of the formation of the resist mask in the third photolithography step may be performed using ultraviolet light, KrF laser light, or ArF laser light. A channel length L of the transistor formed later is determined by the distance between the lower edge portion of the source electrode layer and the lower edge portion of the drain electrode layer which face to each other over the oxide semiconductor layer 531. In the case where a channel length L is less than 25 nm, light exposure for formation of the resist mask in the third photolithography step may be performed using extreme ultraviolet light having an extremely short wavelength of several nanometers to several tens of nanometers. In the light exposure by extreme ultraviolet light, the resolution is high and the focus depth is large. For these reasons, the channel length L of the transistor to be formed later can be in the range of 10 nm to 1000 nm inclusive, and the circuit can operate at higher speed.

In order to reduce the number of photomasks used in a photolithography step and reduce the number of steps, an etching step may be performed with the use of a multi-tone mask which is a light-exposure mask through which light is transmitted to have a plurality of intensities. A resist mask formed with use of a multi-tone mask has a plurality of thicknesses and further can be changed in shape by etching; therefore, the resist mask can be used in a plurality of etching steps for processing into different patterns. Therefore, a resist mask corresponding to at least two or more kinds of different patterns can be formed with one multi-tone mask. Thus, the number of light-exposure masks can be reduced and the number of corresponding photolithography steps can be also reduced, whereby simplification of a process can be realized.

Note that when the conductive film is etched, the optimum etching condition is desirably made so that the oxide semiconductor layer 531 can be prevented to be etched together with the conductive film and divided. However, it is difficult to attain such a condition that only the conductive film is etched and the oxide semiconductor layer 531 is not etched at all. In etching of the conductive film, the oxide semiconductor layer 531 is partly etched in some cases, whereby the oxide semiconductor layer having a groove portion (a depressed portion) is formed.

In this embodiment, since a titanium (Ti) film is used as the conductive film and the In—Ga—Zn—O-based oxide semiconductor is used for the oxide semiconductor layer 531, an ammonium hydrogen peroxide mixture (31 wt. % hydrogen peroxide water: 28 wt. % ammonia water: water=5:2:2) is used as an etchant of the Ti film.

Next, by plasma treatment using a gas such as $N_2O$, $N_2$, or Ar, water or the like adsorbed on a surface of an exposed portion of the oxide semiconductor layer may be removed. In the case where the plasma treatment is performed, the insulating layer 516 which serves as a protective insulating film in contact with part of the oxide semiconductor layer is formed without exposure of the oxide semiconductor layer to the air.

The insulating layer 516 can be formed to a thickness of at least 1 nm by a method by which an impurity such as water or hydrogen does not enter the insulating layer 516, such as a sputtering method as appropriate. When hydrogen is contained in the insulating layer 516, the hydrogen enters the oxide semiconductor layer or extracts oxygen from the oxide semiconductor layer, which causes a reduction in resistance of a back channel of the oxide semiconductor layer (i.e., makes an n-type back channel), so that a parasitic channel might be formed. Therefore, it is important for the insulating layer 516 that hydrogen is not used in a formation method in order to contain hydrogen as little as possible.

As the insulating layer 516 which is formed in contact with the oxide semiconductor layer, an inorganic insulating film which does not include an impurity such as moisture, a hydrogen ion, or $OH^-$ and blocks the entry of the impurity from the outside is used. Typically, a silicon oxide film, a silicon oxynitride film, an aluminum oxide film, an aluminum oxynitride film, or the like is used. In this embodiment, a silicon oxide film is formed to a thickness of 200 nm as the insulating layer 516 by a sputtering method. The substrate temperature in film formation may be higher than or equal to room temperature and lower than or equal to 300° C. and in this embodiment, is 100° C. The silicon oxide film can be formed by a sputtering method in a rare gas (typically argon) atmosphere, an oxygen atmosphere, or a mixed atmosphere containing a rare gas and oxygen. As a target, a silicon oxide target or a silicon target may be used. For example, the silicon oxide film can be formed using a silicon target by a sputtering method in an atmosphere containing oxygen.

As in the case of formation of the oxide semiconductor film 530, an adsorption-type vacuum pump (such as a cryopump) is preferably used in order to remove remaining moisture in a deposition chamber of the insulating layer 516. When the insulating layer 516 is deposited in the deposition chamber which is evacuated with use of a cryopump, the concentration of an impurity contained in the insulating layer 516 can be reduced. Alternatively, the evacuation unit used for removal of the remaining moisture in the deposition chamber may be a turbo pump provided with a cold trap.

It is preferable that a high-purity gas from which impurities such as hydrogen, water, a compound containing a hydroxyl group, or a hydride are removed be used as a sputtering gas used for forming the insulating layer 516.

Next, second heat treatment is performed in an inert gas atmosphere or an oxygen gas atmosphere (preferably at from 200° C. to 400° C. inclusive, e.g. 250° C. to 350° C. inclusive). For example, the second heat treatment is performed in a nitrogen atmosphere at 250° C. for one hour. The second heat treatment is performed in such a condition that part (a channel formation region) of the oxide semiconductor layer is in contact with the insulating layer 516.

As described above, an impurity such as hydrogen, moisture, a hydroxyl group, or a hydride (also referred to as a hydrogen compound) is intentionally removed from the oxide semiconductor layer by subjecting the oxide semiconductor layer to the first heat treatment, and then oxygen which is one of main components of the oxide semiconductor can be supplied because oxygen is reduced in the step of removing impurities. Through the above steps, the oxide semiconductor layer is highly purified and is made to be an electrically i-type (intrinsic) semiconductor.

Through the above process, the transistor 510 is formed (see FIG. 7D).

When a silicon oxide layer having a lot of defects is used as the insulating layer 516, an impurity such as hydrogen, moisture, a hydroxyl group, or a hydride contained in the oxide semiconductor layer can be diffused by the heat treatment which is performed after the formation of the silicon oxide layer, so that impurities in the oxide semiconductor layer can be further reduced.

A protective insulating layer 506 may be formed over the insulating layer 516. As the protective insulating layer, an inorganic insulating film which does not include an impurity such as moisture and blocks entry of the impurity from the outside, e.g., a silicon nitride film, an aluminum nitride film, or the like is used. In this embodiment, the protective insulating layer 506 is formed using a silicon nitride film by an RF sputtering method since an RF sputtering method has high productivity (see FIG. 7E).

In this embodiment, as the protective insulating layer 506, a silicon nitride film is formed by heating the substrate 505 over which the steps up to and including the formation step of the insulating layer 516 have been done, to a temperature of 100° C. to 400° C., introducing a sputtering gas including high-purity nitrogen from which hydrogen and moisture are removed, and using a silicon semiconductor target. In that case also, it is preferable that remaining moisture be removed from a deposition chamber in the formation of the protective insulating layer 506 as in the case of the insulating layer 516.

After the formation of the protective insulating layer, heat treatment may be further performed at a temperature from 100° C. to 200° C. inclusive in the air for one hour to 30 hours inclusive. This heat treatment may be performed at a fixed heating temperature. Alternatively, the following change in the heating temperature may be conducted plural times repeatedly: the heating temperature is increased from room temperature to a temperature of 100° C. to 200° C. inclusive and then decreased to room temperature.

A transistor including a highly purified oxide semiconductor layer which is manufactured in accordance with this embodiment as described achieves high filed-effect mobility and thus can operate at high speed. When the transistor including a highly purified oxide semiconductor layer is used in a pixel portion in the liquid crystal display device, color separation can be suppressed and a high-quality image can be provided. In addition, a driver circuit portion and a pixel portion which include the transistors including a highly purified oxide semiconductor layer can be formed over one substrate; thus, the number of components of the liquid crystal display device can be reduced.

Measurement results of the field-effect mobility of a transistor including a highly purified oxide semiconductor are described.

Figure 8:
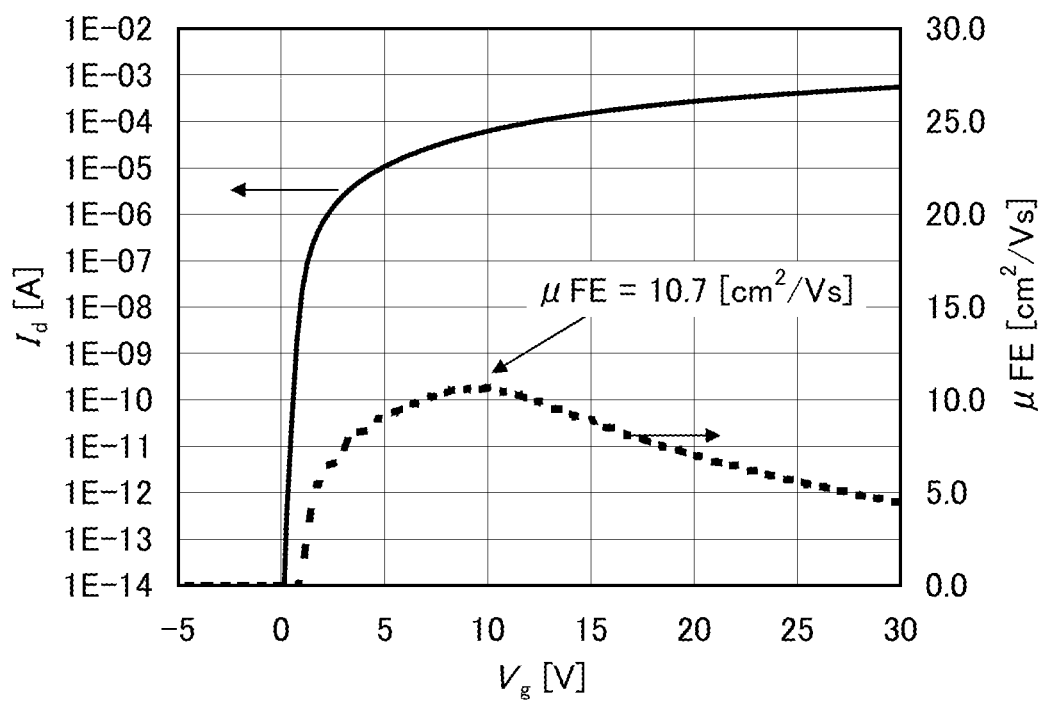
FIG. 8 is a graph showing an example of $V_g$-$I_d$ characteristics of a transistor including an oxide semiconductor.

In accordance with the above manufacturing method of this embodiment, a transistor (L/W=10 µm/50 µm) including a highly purified oxide semiconductor (an In—Ga—Zn—O-based oxide semiconductor film with a thickness of 50 nm) was manufactured, and a change in characteristics of source-drain current (hereinafter, referred to as drain current or $I_d$) was measured under conditions that the substrate temperature was set to room temperature, source-drain voltage (hereinafter, referred to as drain voltage or $V_d$) was set to 10 V, and source-gate voltage (hereinafter, referred to as gate voltage or $V_g$) was changed from −30 V to +30 V. That is, $V_g$-$I_d$ characteristics were measured. Note that in FIG. 8, the range of $V_g$ is from −5 V to +V. From FIG. 8, the maximum value of field-effect mobility of the transistor including a highly purified oxide semiconductor layer was confirmed to be 10.7 cm²/Vsec.

It should be noted that the transistor including a highly purified oxide semiconductor shows an extremely low current value in an off state (off-current value). Therefore, the holding period of an electric signal of an image signal or the like can be extended and an interval between writing operations can be set longer. Thus, the frequency of refresh operation can be reduced, whereby a decrease in consumed power can be more effectively improved.

Measurement results of the off current of a transistor including a highly purified oxide semiconductor are described.

Figure 9:
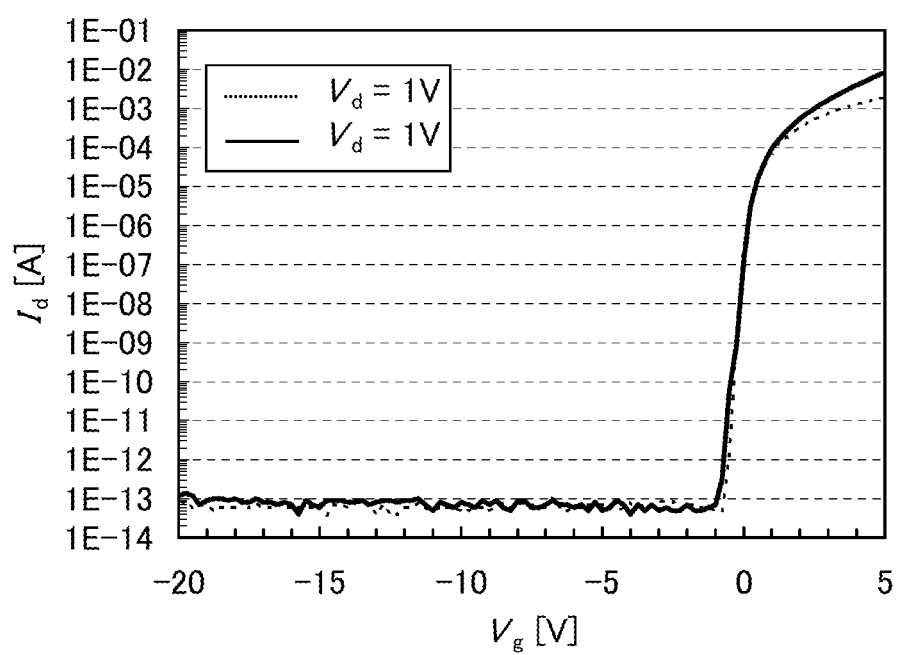
FIG. 9 is a graph for describing off-state characteristics of $V_g$-$I_d$ characteristics of a transistor including an oxide semiconductor.

In accordance with the above manufacturing method of this embodiment, a transistor including a highly purified oxide semiconductor was manufactured. First, a transistor with a sufficiently large channel width W of 1 cm was prepared in consideration of the very small off current of the transistor including a highly purified oxide semiconductor, and the off current was measured. FIG. 9 shows the measurement results of the off current of the transistor with a channel width W of 1 cm. In FIG. 9, the horizontal axis indicates the gate voltage $V_g$ and the vertical axis indicates the drain current $I_d$. In the case where the drain voltage $V_d$ is +1 V or +10 V, the off current of the transistor with the gate voltage $V_g$ within the range of −5 V to −20 V was found to be smaller than or equal to $1\times10^{-13}$ A which is the detection limit. Moreover, it was found that the off current of the transistor (per unit channel width (1 µm)) was smaller than or equal to 10 aA/µm ($1\times10^{-17}$ A/µm).

Next, more accurate measurement results of the off current of the transistor including a highly purified oxide semiconductor are described. As described above, the off current of the transistor including a highly purified oxide semiconductor was found to be smaller than or equal to $1\times10^{-13}$ A which is the detection limit of measurement equipment. Thus, more accurate off current (the value smaller than or equal to the detection limit of measurement equipment in the above measurement) was measured with use of a test element group (TEG). The results thereof will be described.

The test element group used in the current measurement is described below.

As the test element group, three measurement systems which are connected in parallel are used. Each measurement system includes a capacitor, a first transistor, a second transistor, a third transistor, and a fourth transistor. The first to fourth transistors were manufactured in accordance with this embodiment, and each transistor had the same structure as the transistor 510 illustrated in FIG. 7D.

In each measurement system, one of a source terminal and a drain terminal of the first transistor, one of terminals of the capacitor, and one of a source terminal and a drain terminal of the second transistor are connected to a power supply (a power supply for supplying V2). The other of the source terminal and the drain terminal of the first transistor, one of a source terminal and a drain terminal of the third transistor, the other of the terminals of the capacitor, and a gate terminal of the second transistor are connected to one another. The other of a source terminal and a drain terminal of the third transistor, one of a source terminal and a drain terminal of the fourth transistor, and a gate terminal of the fourth transistor are connected to a power supply (a power supply for supplying V1). The other of the source terminal and the drain terminal of the second transistor and the other of the source terminal and the drain terminal of the fourth transistor are connected to an output terminal.

A potential $V_{ext\_b2}$ for controlling on and off of the first transistor is supplied to the gate terminal of the first transistor. A potential $V_{ext\_b1}$ for controlling on and off of the third transistor is supplied to the gate terminal of the third transistor. A potential $V_{out}$ is output from the output terminal.

Then, the measurement of the off current with use of the above measurement systems is described.

First, a potential difference is given between the source terminal and the drain terminal of the first transistor and between the source terminal and the drain terminal of the third transistor in an initialization period. After the initialization is completed, the potential of the gate terminal of the second transistor varies over time due to the off current of the first and third transistors. Accordingly, potential of the output potential $V_{out}$ of the output terminal varies over time. Then, the off current can be calculated with the thus obtained output potential $V_{out}$.

Each of the first to fourth transistors is a transistor including a highly purified oxide semiconductor with a channel length L of 10 μm and a channel width W of 50 μm. In the three measurement systems arranged in parallel, the capacitance of the capacitor in the first measurement system was 100 fF, the capacitance of the capacitor in the second measurement system was 1 pF, and the capacitance of the capacitor in the third measurement system was 3 pF.

V1 and V2 were appropriately set to be 5 V or 0 V in order to provide the potential difference between the source terminal and the drain terminal of the first transistor and between the source terminal and the drain terminal of the third transistor. The measurement was carried out in every 10 to 300 seconds, and the potential $V_{out}$ was measured for 100 msec in every measurement. The measurement was conducted until 30000 seconds have passed after the initialization.

Figure 10:
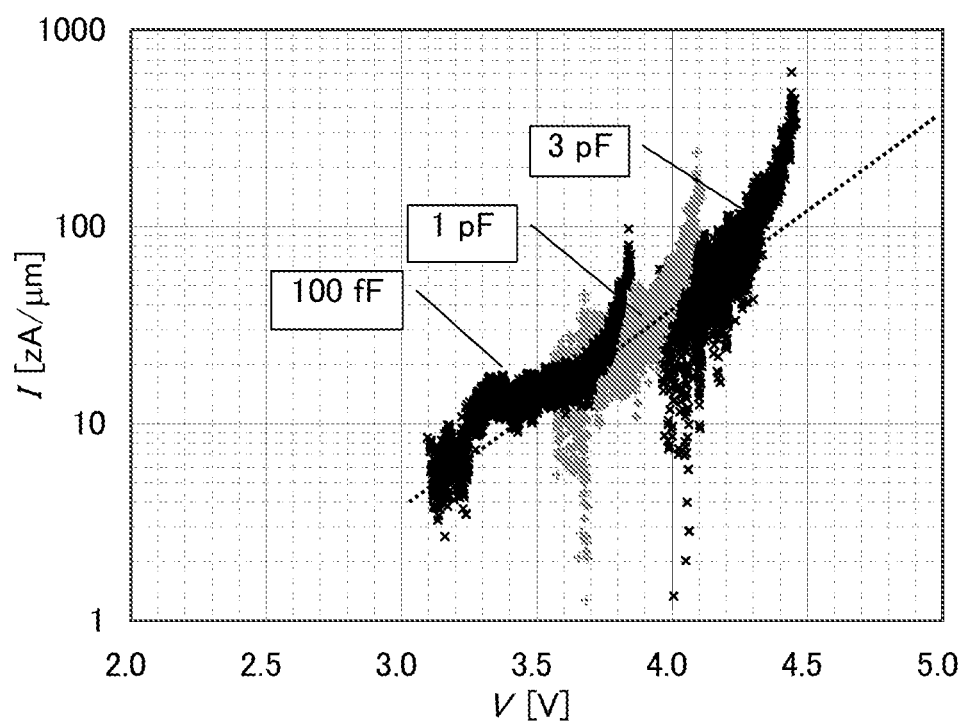
FIG. 10 is a graph showing a relation between source-drain voltage $V_g$ and off current $I_d$.

FIG. 10 shows the off current which was calculated in the above current measurement. FIG. 10 further shows the relationship between source-drain voltage V and off current I. According to FIG. 10, the off current was about 40 zA/μm at the source-drain voltage of 4 V. In a similar way, the off current was less than or equal to 10 zA/μm at the source-drain voltage of 3.1 V. Note that 1 zA represents $10^{-21}$ A.

According to this embodiment, it was confirmed that the off current can be sufficiently small in a transistor including a highly purified oxide semiconductor.

Embodiment 6

A liquid crystal display device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the liquid crystal display device described in the above embodiment are described.

Figure 11A:
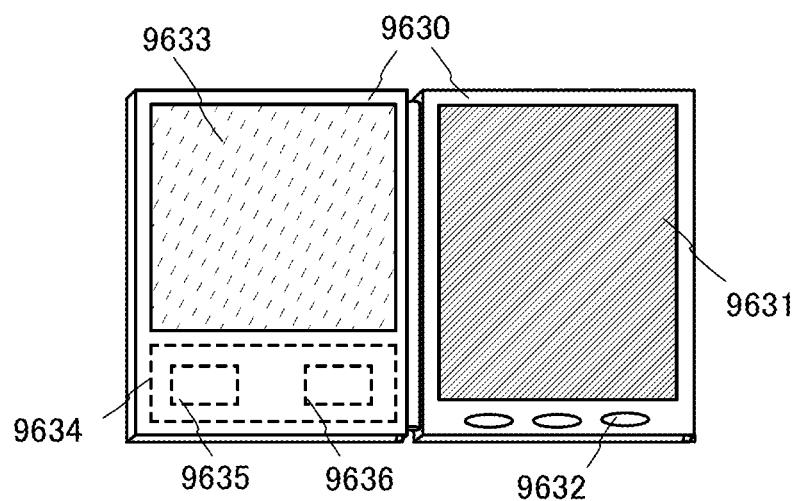
FIGS. 11A and 11B are diagrams illustrating an example of an electronic book reader according to the present invention.

FIG. 11A illustrates an electronic book reader (also referred to as an e-book reader), which includes housings 9630, a display portion 9631, operation keys 9632, a solar cell 9633, and a charge and discharge control circuit 9634. The e-book reader illustrated in FIG. 11A has a function of displaying various kinds of information (e.g., a still image, a moving image, and a text image) on the display portion, a function of displaying a calendar, a date, the time, or the like on the display portion, a function of operating or editing the information displayed on the display portion, a function of controlling processing by various kinds of software (programs), and the like. Note that, in FIG. 11A, the charge and discharge control circuit 9634 has a battery 9635 and a DCDC converter (hereinafter, abbreviated as a converter) 9636 as an example. When the liquid crystal display device described in any of Embodiments 1 to 5 is applied to the display portion 9631, an e-book reader which consumes less power can be provided.

In the case of using a transflective or reflective liquid crystal display device as the display portion 9631 in the structure illustrated in FIG. 11A, the e-book reader may be used in a comparatively bright environment. In that case, power generation by the solar cell 9633 and charge by the battery 9635 can be effectively performed, which is preferable. Since the solar cell 9633 can be provided on a space (a surface or a rear surface) of the housing 9630 as appropriate, the battery 9635 can be efficiently charged, which is preferable. When a lithium ion battery is used as the battery 9635, there is an advantage of downsizing or the like.

Figure 11B:
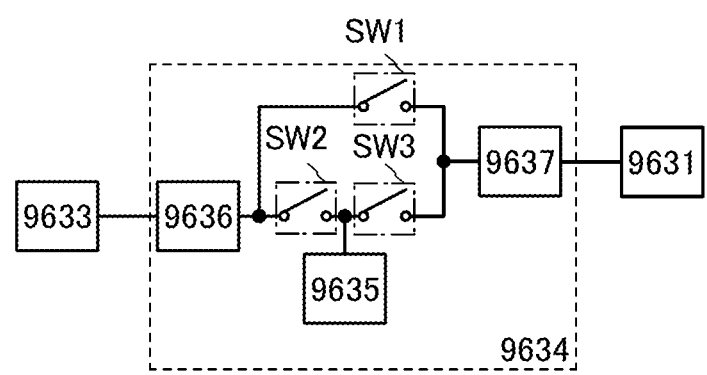

A configuration and operation of the charge and discharge control circuit 9634 illustrated in FIG. 11A is described with reference to a block diagram of FIG. 11B. FIG. 11B shows the solar cell 9633, the battery 9635, the converter 9636, a converter 9637, switches SW1 to SW3, and the display portion 9631. The charge and discharge control circuit 9634 includes the battery 9635, the converter 9636, the converter 9637, and the switches SW1 to SW3.

First, explanation is given to an operation example in the case where the solar cell 9633 generates power by using external light. The power generated by the solar cell is raised or lowered by the converter 9636 to be the voltage which is stored in the battery 9635. When the power from the solar cell 9633 is used for operation of the display portion 9631, the switch SW1 is turned on and the power is raised or lowered by the converter 9637 to be the voltage needed for the display portion 9631. When display is not performed on the display portion 9631, the switch SW1 may be turned off and the switch SW2 may be turned on, whereby the battery 9635 is charged.

Next, an example of operation is described for the case when the solar cell 9633 does not generate power by using external light. The power stored in the battery 9635 is raised or lowered by the converter 9637 when the switch SW3 is turned on. Then, the power from the battery 9635 is used for operation of the display portion 9631.

Note that the solar cell 9633 is described as an example of a charging unit here; however, charging the battery 9635 may be performed by another unit. Alternatively, a combination of another charging unit may be used.

Figure 12:
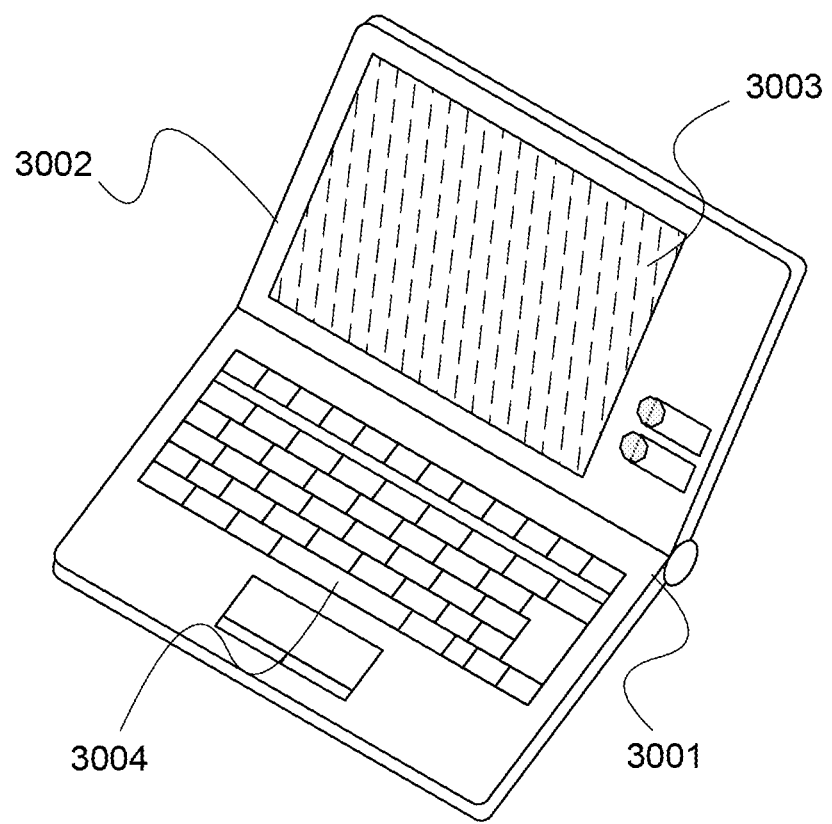
FIG. 12 is a diagram illustrating an example of a computer according to the present invention.

FIG. 12 illustrates a laptop personal computer which includes a main body 3001, a housing 3002, a display portion 3003, a keyboard 3004, and the like. When the liquid crystal display device described in any of Embodiments 1 to 5 is applied to the display portion 3003, power consumption in a laptop personal computer can be small.

This embodiment can be implemented in appropriate combination with the structures described in the other embodiments.

This application is based on Japanese Patent Application serial no. 2010-012663 filed with Japan Patent Office on Jan. 24, 2010, the entire contents of which are hereby incorporated by reference.

EXPLANATION OF REFERENCE

100: liquid crystal display device, 113: display control circuit, 116: power supply, 120: display panel, 121: driver circuit portion, 121A: gate line driver circuit, 121B: source line driver circuit, 122: pixel portion, 123: pixel, 124: gate line, 125: source line, 126: terminal portion, 128: common electrode, 210: capacitor, 213: pixel, 214: transistor, 215: liquid crystal element, 225: hole-injection layer, 400: substrate, 401: gate electrode layer, 402: gate insulating layer. 403: oxide semiconductor layer, 405a: source electrode layer, 405b: drain electrode layer, 407: insulating film, 409: protective insulating layer, 410: transistor, 411: pixel electrode, 412: contact hole, 413: alignment film, 414: liquid crystal layer, 415: counter electrode, 416: counter substrate, 417: capacitor wiring layer, 418: capacitor electrode layer, 419: storage capacitor, 420: transistor, 427: insulating layer, 430: transistor, 436a: wiring layer, 436b: wiring layer, 437: insulating layer, 440: transistor, 505: substrate, 506: protective insulating layer, 507: gate insulating layer, 510: transistor, 511: gate electrode layer, 515a: source electrode layer, 515b: drain electrode layer, 516: insulating layer, 530: oxide semiconductor film, 531: oxide semiconductor layer, 700: housing, 701: display module, 702: speaker, 703: operation key, 704: external connection terminal, 705: illuminance sensor, 710: television receiver, 711: tuner, 712: digital demodulation circuit, 713: video signal processing circuit, 714: audio signal processing circuit, 715: display adjusting circuit, 716: display control circuit, 717: display panel, 718: gate line driver circuit, 719: source line driver circuit, 720: speaker, 721: antenna, 722: external input portion, 723: dotted line portion, 800: housing. 801: display module, 802: speaker, 803: external connection terminal. 804: window-type display portion. 810: PC monitor, 813: video signal processing circuit, 814: audio signal processing circuit, 816: display control circuit, 817: display panel, 818: gate line driver circuit, 819: source line driver circuit, 820: speaker, 821: external arithmetic circuit, 822: external operation means, 823: dotted line portion, 1001: anode, 1002: cathode, 1003: EL layer, 1004: intermediate layer, 1011: hole-injection layer, 1012: hole-transport layer, 1013: light-emitting layer, 1014: electron-transport layer, 1015: electron-injection layer, 1020: substrate, 1025: EL element, 3001: main body, 3002: housing, 3003: display portion, 3004: keyboard, 5201: backlight portion, 5202: diffusion plate, 5203: light guide plate, 5204: reflection plate, 5205: lamp reflector, 5206: light source, 5207: display panel, 5222: lamp reflector, 5223: light-emitting diode (LED), 5290: backlight portion, 5291: diffusion plate, 5292: light-shielding portion, 5293: lamp reflector, 5294: light source, 5295: liquid crystal panel, 9630: housing, 9631: display portion, 9632: operation key, 9633: solar cell, 9634: charge and discharge control circuit, 9635: battery, 9636: converter, and 9637: converter.

The invention claimed is:

1. A liquid crystal display device comprising a pixel, the pixel comprising:
a transistor; and
a liquid crystal element electrically connected to the transistor,
wherein the transistor comprises:
a gate electrode;
a first insulating layer over the gate electrode;
an oxide semiconductor layer over the first insulating layer;
a source electrode and a drain electrode over the oxide semiconductor layer; and
a second insulating layer over the source electrode and the drain electrode,
wherein the transistor has a characteristic that a current flowing between the source electrode and the drain electrode is lower than 10 zA/μm at room temperature when a voltage of 3.1 V is applied between the source electrode and the drain electrode, and
wherein the current is normalized by a channel width of the transistor.

2. A display device comprising:
a transistor; and
a pixel electrode electrically connected to the transistor,
wherein the transistor comprises:
a gate electrode;
a gate insulating film over the gate electrode;
a semiconductor film comprising a channel formation region, over the gate electrode with the gate insulating film therebetween;
a source electrode over and electrically connected to the semiconductor film; and
a drain electrode over and electrically connected to the semiconductor film; and
wherein the transistor has a characteristic that a current flowing between the source electrode and the drain electrode is lower than 10 zA/μm at room temperature when a voltage of 3.1 V is applied between the source electrode and the drain electrode,
wherein the current is normalized by a channel width of the transistor,
wherein the semiconductor film comprises indium, zinc, and oxygen, and
wherein an energy gap of the semiconductor film is larger than or equal to 2 eV.

3. The display device according to claim 2, wherein the semiconductor film comprises at least one metal element selected from the group consisting of gallium, aluminum, manganese, and cobalt.

4. The display device according to claim 2, comprising an insulating film over the semiconductor film, wherein the source electrode and the drain electrode are over the insulating film.

5. The display device according to claim 4, wherein the source electrode and the drain electrode are in contact with the gate insulating film.

6. The display device according to claim 2, comprising a liquid crystal layer over the pixel electrode.

7. The display device according to claim 6, comprising a counter electrode over the liquid crystal layer.

8. The display device according to claim 2, wherein the semiconductor film is intrinsic or substantially intrinsic.

9. The display device according to claim 2, wherein the semiconductor film comprises a crystalline region.

10. The display device according to claim 9, wherein the crystalline region has a c-axis orientation with respect to a surface of the semiconductor film.

11. A display device comprising:
a transistor; and
a pixel electrode electrically connected to the transistor,
wherein the transistor comprises:
a gate electrode;
a gate insulating film over the gate electrode;
a semiconductor film comprising a channel formation region, over the gate electrode with the gate insulating film therebetween;
a source electrode over and electrically connected to the semiconductor film; and
a drain electrode over and electrically connected to the semiconductor film; and
wherein the transistor has a characteristic that a current flowing between the source electrode and the drain electrode is lower than 10 zA/μm at room temperature when a voltage of 3.1 V is applied between the source electrode and the drain electrode,
wherein the current is normalized by a channel width of the transistor.

12. The display device according to claim 11, wherein the semiconductor film comprises at least one metal element selected from the group consisting of gallium, aluminum, manganese, and cobalt.

13. The display device according to claim 11, comprising an insulating film over the semiconductor film, wherein the source electrode and the drain electrode are over the insulating film.

14. The display device according to claim 13, wherein the source electrode and the drain electrode are in contact with the gate insulating film.

15. The display device according to claim 11, comprising a liquid crystal layer over the pixel electrode.

16. The display device according to claim 15, comprising a counter electrode over the liquid crystal layer.

17. The display device according to claim 11, wherein the semiconductor film is intrinsic or substantially intrinsic.

18. The display device according to claim 11, wherein the semiconductor film comprises a crystalline region.

19. The display device according to claim 18, wherein the crystalline region has a c-axis orientation with respect to a surface of the semiconductor film.

* * * * *